United States Patent
Yang et al.

(10) Patent No.: US 8,541,306 B2
(45) Date of Patent: Sep. 24, 2013

(54) SEMICONDUCTOR DEVICE AND METHOD OF DOUBLE PHOTOLITHOGRAPHY PROCESS FOR FORMING PATTERNS OF THE SEMICONDUCTOR DEVICE

(75) Inventors: Song-yi Yang, Seoul (KR); Seung-pil Chung, Seoul (KR); Dong-hyun Kim, Hwaseong-si (KR); O-ik Kwon, Seongnam-si (KR); Hong Cho, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 93 days.

(21) Appl. No.: 12/983,478

(22) Filed: Jan. 3, 2011

(65) Prior Publication Data

US 2012/0049377 A1    Mar. 1, 2012

(30) Foreign Application Priority Data

Sep. 1, 2010   (KR) .................. 10-2010-0085510

(51) Int. Cl.
*H01L 23/52* (2006.01)
*H01L 21/302* (2006.01)
*H01L 21/768* (2006.01)

(52) U.S. Cl.
USPC ............ 438/669; 257/E23.141; 257/E21.575; 257/E21.214; 257/773; 438/703

(58) Field of Classification Search
USPC ................. 438/703, 669; 257/773, E23.141, 257/E21.575, E21.214
See application file for complete search history.

(56) References Cited

U.S. PATENT DOCUMENTS

| 7,807,575 B2 * | 10/2010 | Zhou | 438/696 |
| 2008/0122125 A1 * | 5/2008 | Zhou | 257/797 |
| 2009/0093121 A1 * | 4/2009 | Moon | 438/696 |
| 2009/0263749 A1 * | 10/2009 | Sim et al. | 430/319 |

* cited by examiner

*Primary Examiner* — Kevin Parendo
*Assistant Examiner* — Lamont Koo
(74) *Attorney, Agent, or Firm* — Harness, Dickey & Pierce, P.L.C.

(57) ABSTRACT

A semiconductor device and a method of forming patterns on a semiconductor device are disclosed. The semiconductor device may include high-density patterns with a minimum size that may be less the resolution limit of a photolithography process, and may have a substrate including a memory cell region and an adjacent connection region, a plurality of first conductive lines extending from the memory cell region to the connection region in a first direction, a plurality of second conductive lines connected from respective first conductive lines to a plurality of pads having a width equal to twice the width of each of the first conductive lines. The method may include two levels of spacer formation to provide sub resolution line widths and spaces as well as selected multiples of the minimum line widths and spaces.

20 Claims, 31 Drawing Sheets

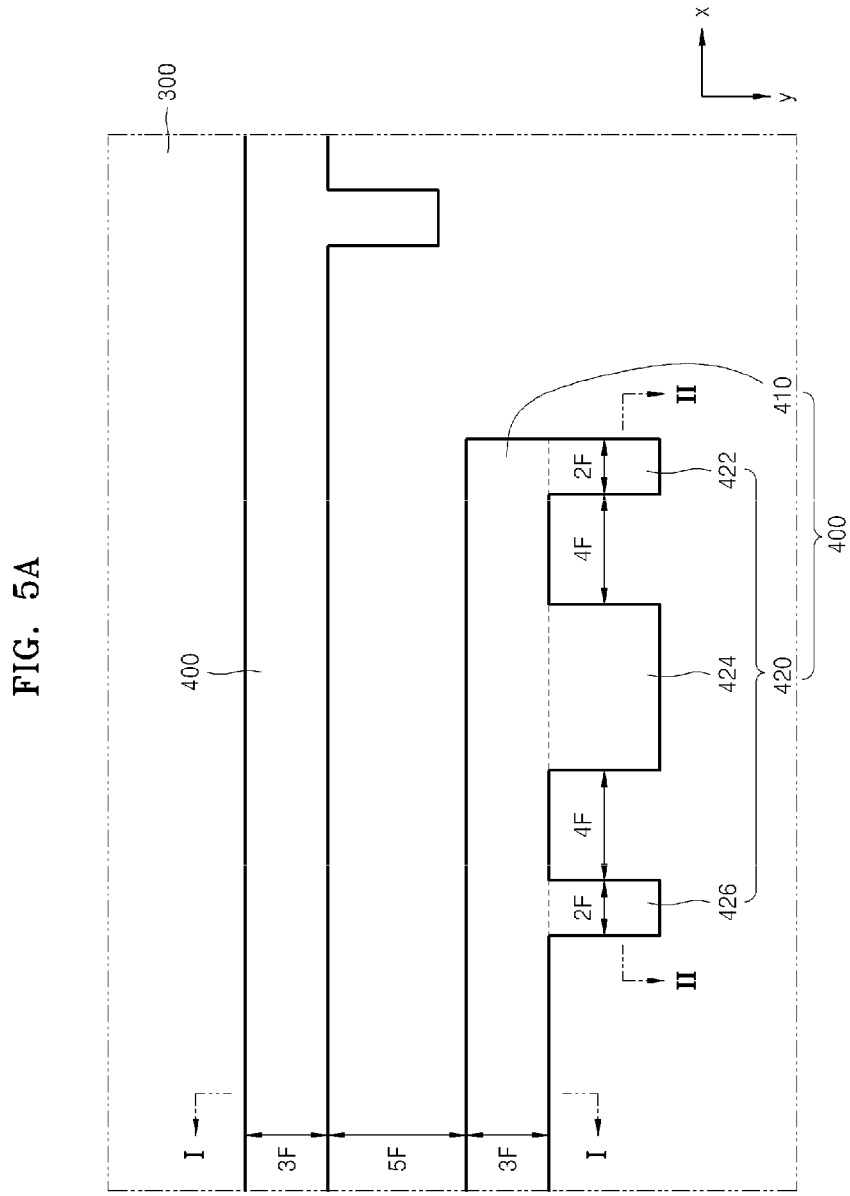

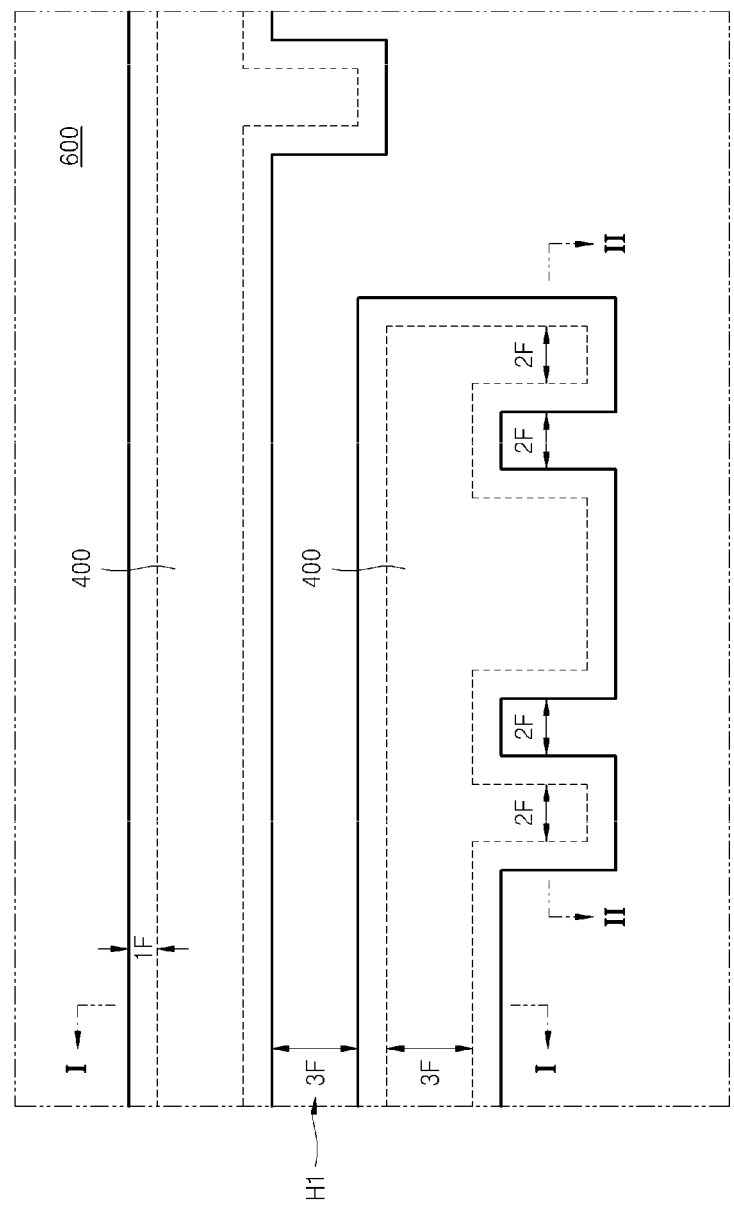

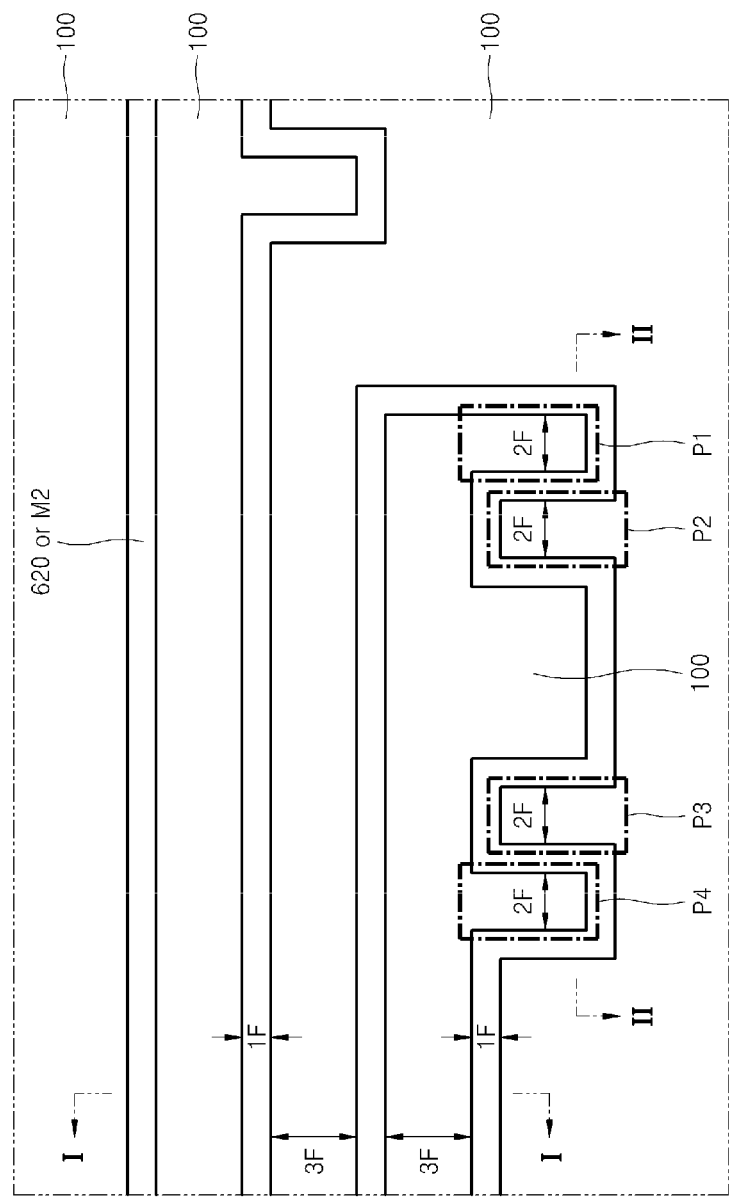

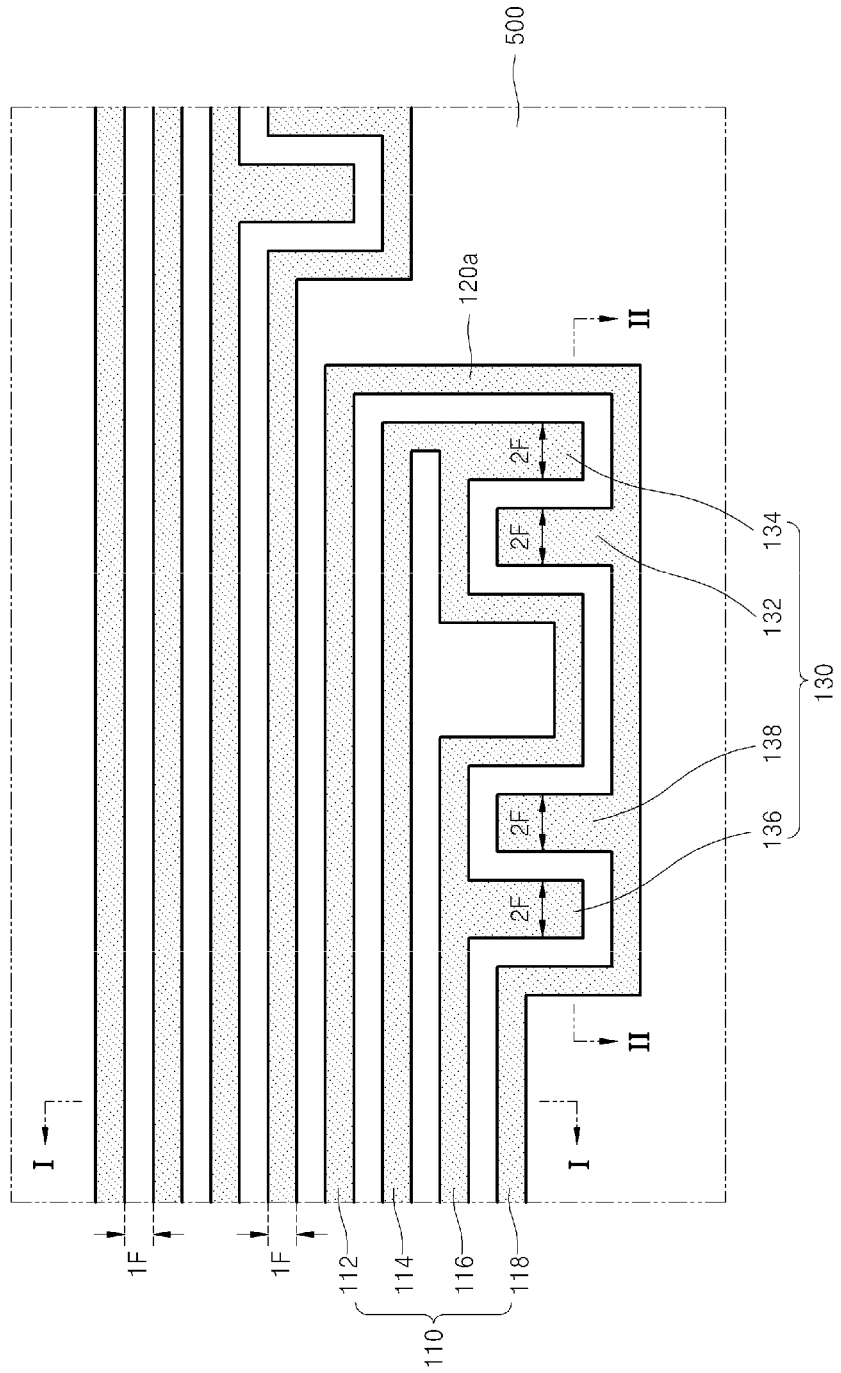

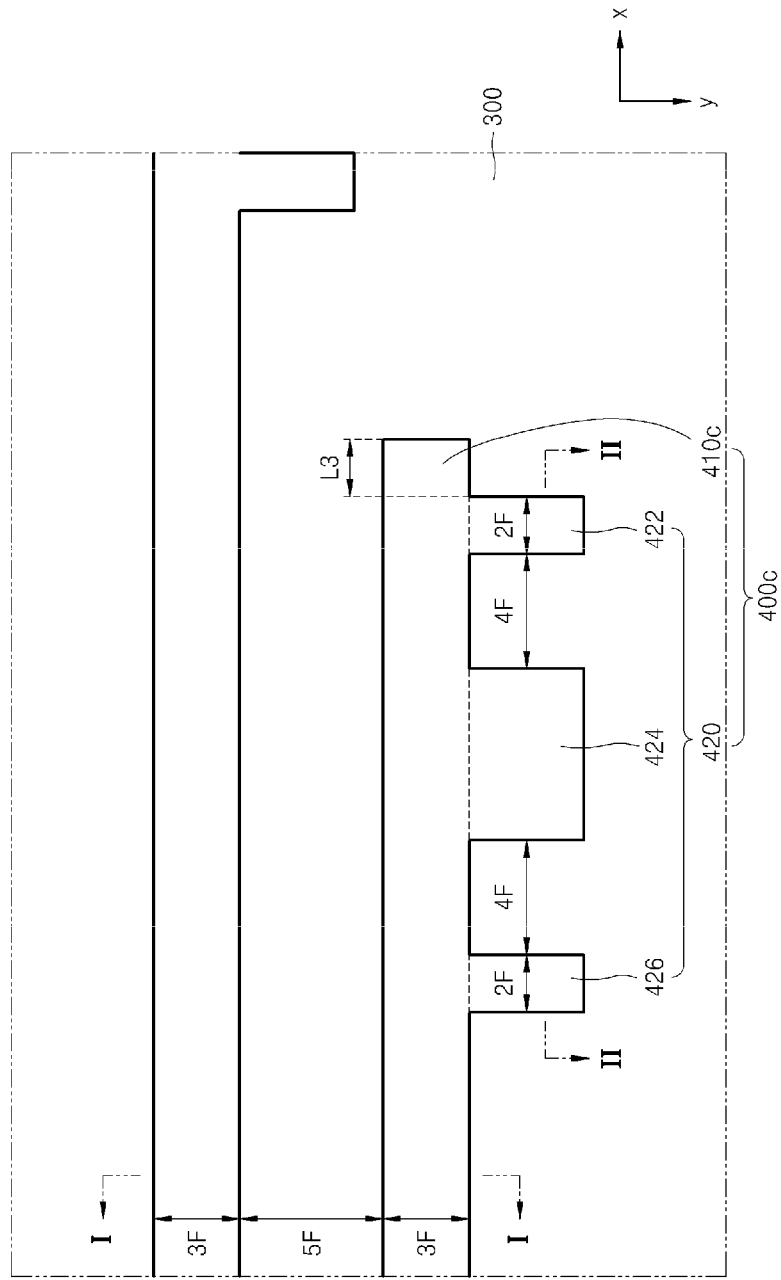

US 8,541,306 B2

SEMICONDUCTOR DEVICE AND METHOD OF DOUBLE PHOTOLITHOGRAPHY PROCESS FOR FORMING PATTERNS OF THE SEMICONDUCTOR DEVICE

CROSS-REFERENCE TO RELATED APPLICATIONS

This application claims the benefit of Korean Patent Application No. 10-2010-0085510, filed on Sep. 1, 2010, in the Korean Intellectual Property Office, the disclosure of which is incorporated herein in its entirety by reference.

BACKGROUND

The inventive concept relates to semiconductor devices and a method of forming patterns on semiconductor devices, and more particularly, to a semiconductor device including sub resolution limit patterns with ultrafine widths and spaces disposed in a high-density region, and a method of forming the sub resolution limit masking patterns.

Fabrication of ultra-large-scale-integration (ULSI) semiconductor devices may involve forming fine patterns with line widths and spaces between the lines (which may be referred to as intervals) that may surpass the resolution limit of a photolithography process. Thus, it may be helpful to develop a method of forming fine patterns that are below the resolution limit of the photolithography process, and these sub resolution patterns may be used to form semiconductor devices with higher density and higher speed of operation.

BRIEF DESCRIPTION OF THE DRAWINGS

Exemplary embodiments of the inventive concept will be more clearly understood from the following detailed description taken in conjunction with the accompanying drawings in which:

FIGS. 17A and 17B are respectively a plane views illustrating a method of forming patterns of a semiconductor device according to yet another exemplary embodiment of the inventive concept;

DETAILED DESCRIPTION OF THE EMBODIMENTS

Figure 1:
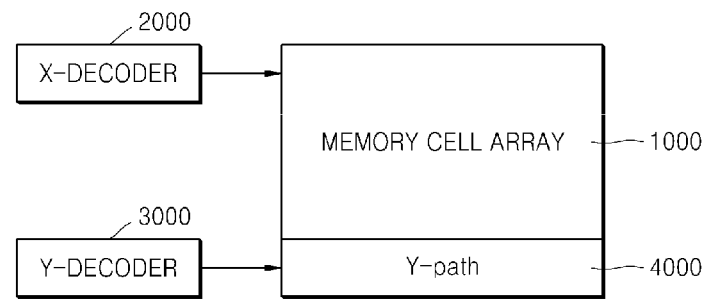
FIG. 1 is a block diagram of a memory device according to an exemplary embodiment of the inventive concept.

The present inventive concept will now be described more fully with reference to the accompanying drawings, in which exemplary embodiments of the inventive concept are shown. It will also be understood that when a layer is referred to as being "on" another layer or substrate, it can be directly on the other layer or substrate, or intervening layers may also be present. Like numbers refer to like elements throughout. In the drawings, the size and relative sizes of layers and regions may be exaggerated for clarity. The terminology used herein is for the purpose of describing particular embodiments only and is not intended to be limiting of the inventive concept.

Figure 2:
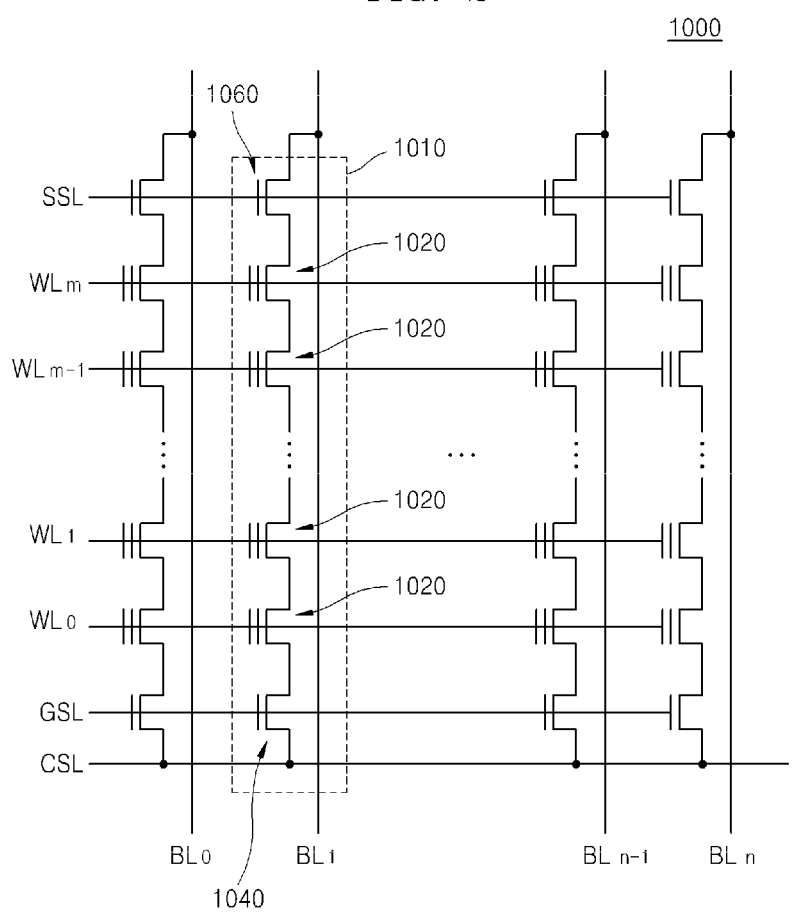
FIG. 2 is a circuit diagram of a memory cell array included in the memory device of FIG. 1.

FIG. 1 is a block diagram of a memory device according to an exemplary embodiment of the inventive concept, and FIG. 2 is a circuit diagram of a memory cell array 1000 included in the memory device of FIG. 1.

Referring to FIGS. 1 and 2, the memory device, such as a NAND flash memory device, may include the memory cell array 1000, an X-decoder block 2000, a Y-decoder block 3000, and a Y-path circuit 4000.

The memory cell array 1000 may be an array of memory cells arranged at a high density. The memory cell array 1000 may have an array structure shown in FIG. 2.

The X-decoder block 2000 may be a peripheral circuit configured to access and drive the memory cell array 1000 and select a word line WL, for example, a word line $WL_0$, $WL_1, \ldots, WL_{m-1}$, or $WL_m$, in the memory cell array 1000 to be accessed.

The Y-decoder block 3000 may select a bit line BL, for example, a bit line $BL_0$, $BL_1, \ldots, BL_{n-1}$, or $BL_n$, in the memory cell array 1000 to be enabled.

The Y-path circuit 4000 may be connected to the memory cell array 1000 and allocate a bit line path based on the output of the Y-decoder block 3000.

Referring to FIG. 2, the memory cell array 1000 may include a plurality of cell strings 1010, and each of the cell strings 1010 may include a plurality of memory cells 1020 connected in series. Gate electrodes of the plurality of memory cells 1020 included in one cell string 1010 may be respectively connected to different word lines $WL_0$, $WL_1, \ldots, WL_{m-1}$, and $WL_m$.

A ground selection transistor 1040 and a string selection transistor 1060 may be disposed on both ends of the cell string 1010 and connected to a ground selection line GSL and a string selection line SSL, respectively. The ground selection transistor 1040 and the string selection transistor 1060 may control electrical connection of the plurality of memory cells 1020 with the bit lines $BL_0$, $BL_1, \ldots, BL_{n-1}$, and $BL_n$ and a common source line CSL. Memory cells connected to one word line through the plurality of cell strings 1010 may be formed in page units or byte units.

The word lines $WL_0$, $WL_1, \ldots, WL_{m-1}$, and $WL_m$ and the bit lines $BL_0$, $BL_1, \ldots, BL_{n-1}$, and $BL_n$ of the memory cell array 1000 may be selected using the X-decoder block 2000 and the Y-decoder block 3000 so that the memory device of FIG. 1 can select a memory cell and perform a read or write operation.

A NAND flash memory device may have a relatively high integration density due to a serially connected structure of a plurality of memory cells. However, due to recent trends towards decreased chip size, it may be beneficial to further reduce the design rules for minimum line width and minimum lines space (which may also be known as the interval) of NAND flash memory devices. In forming fine patterns with reduced design rules, the present inventive concept provides a method of forming patterns which include an adequate process margin and ultrafine conductive lines and pads may be formed using patterns having a size that may be less than the resolution limit of an exposure apparatus and lithography technology.

Figure 3:
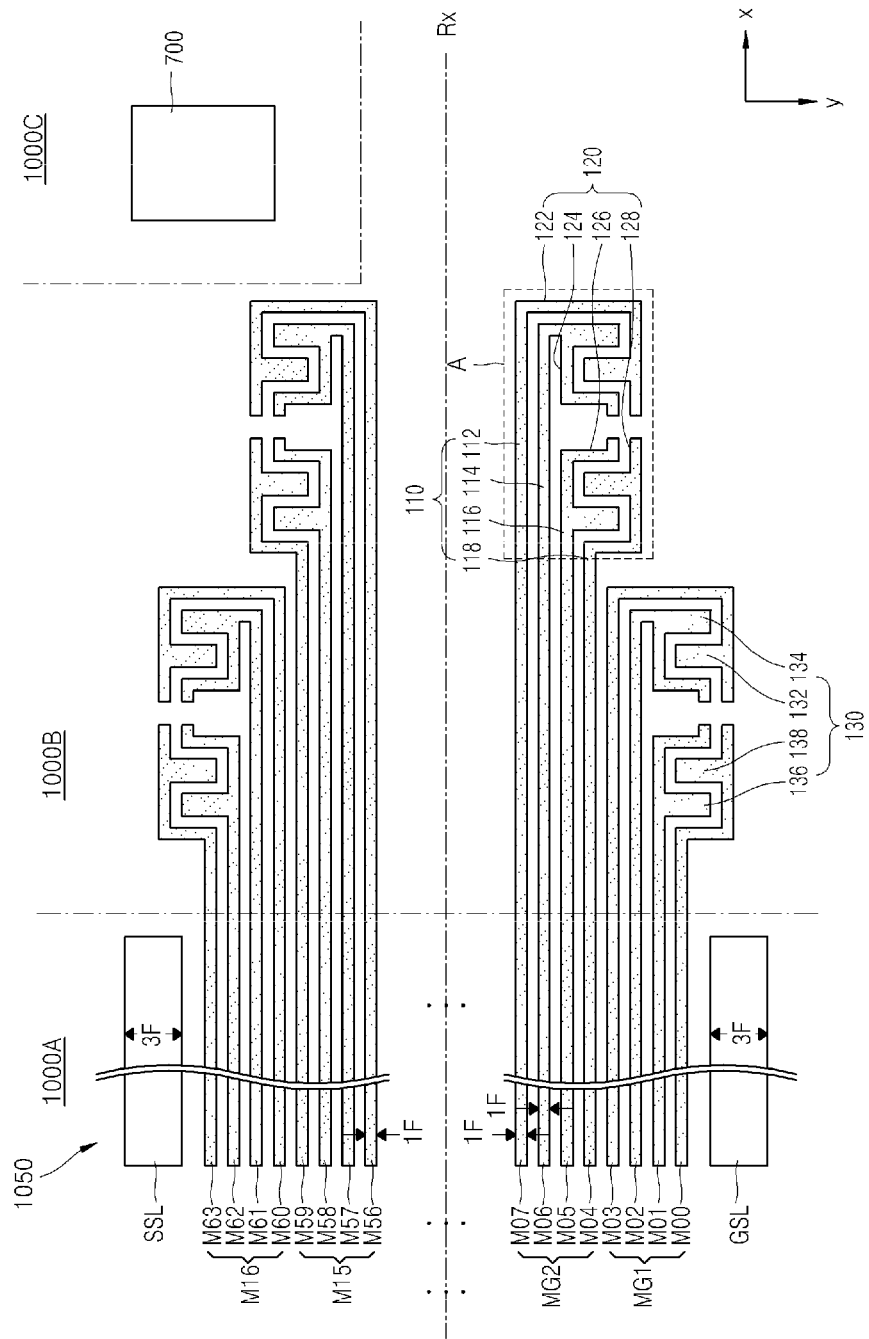
FIG. 3 is a plane view of a portion of a semiconductor device according to an exemplary embodiment of the inventive concept.

FIG. 3 is a plane view of a portion of a semiconductor device according to an exemplary embodiment of the inventive concept.

FIG. 3 illustrates the layout of a portion of a memory cell region 1000A of a NAND flash memory device, a portion of a connection region 1000B configured to connect a plurality of conductive lines, such as a plurality of word lines or a plurality of bit lines, which may connect to a memory cell array in the memory cell region 1000A, or to an external circuit (not shown), such as a decoder, and a portion of a peripheral circuit region 1000C.

The semiconductor device may include a substrate (not shown), a first conductive line structure 110, a second conductive line structure 120, and a pad structure 130. The memory cell region 1000A, the connection region 1000B, and the peripheral circuit region 1000C may be defined on the substrate. Although a plurality of memory cell blocks 1050 may be formed in the memory cell region 1000A, FIG. 3 illustrates only one memory cell block 1050 for brevity.

The substrate may include a semiconductor substrate, for example, a Group IV semiconductor substrate, a Group III-V compound semiconductor substrate, or a Group II-VI oxide semiconductor substrate. For example, the Group IV semiconductor substrate may include a silicon (Si) substrate, a germanium (Ge) substrate, or a silicon-germanium (SiGe) substrate. The substrate may include a bulk wafer or an epitaxial layer. Active regions, isolation layers, a conductive layer, and insulating layers may be foamed on the substrate.

The first conductive line structure 110 may include a plurality of first conductive lines M00, M01, M02, . . . , M61, M62, and M63 disposed between a string selection line SSL and a ground selection line GSL, in the memory cell block 1050. The second conductive line structure 120 may extend from each of the first conductive lines M00, M01, M02, . . . , M61, M62, and M63 in the connection region 1000B and be integrally formed with the first conductive line structure 110.

The pad structure 130 may be integrally formed with the first conductive line structure 110 or the second conductive line structure 120 in the connection region 1000B and function to connect the first conductive line structure 110 with an external circuit (not shown), such as a decoder. The pad structure 130 may be formed at the same time as the first and second conductive line structures 110 and 120, and a first-directional width (which is shown in the figure as being in the x direction) of the pad structure 130 may be twice the width of the first conductive line structure 110.

Hereinafter, the structures of the first conductive line structure 110, the second conductive line structure 120, and the pad structure 130 will be described with reference to FIG. 4. The plurality of first conductive lines M00, M01, M02, . . . , M61, M62, and M63 of the first conductive line structure 110 may extend in the first direction (or x direction) from the memory cell region 1000A to the connection region 1000B and may be parallel to one another. Each of the plurality of first conductive lines M00, M01, M02, . . . , M61, M62, and M63 may be connected to an external circuit (not shown), such as a decoder, through the second conductive line structure 120 and the pad structure 130 disposed in the connection region 1000B. The plurality of first conductive lines M00, M01, M02, . . . , M61, M62, and M63 may be formed on the same plane surface and constitute a plurality of conductive line groups MG1, MG2, . . . , MG15, and MG16, each of which in this illustrative example includes four conductive lines, for example the first through fourth conductive lines 112, 114, 116, and 118 of the first conductive line structure 110. Each of the plurality of conductive line groups MG1, MG2, . . . , MG15, and MG16 may include four conductive lines (i.e., first through fourth conductive lines 122, 124, 126, and 128) of the second conductive line structure 120, and four pads (i.e., first through fourth pads 132, 134, 136, and 138) which may respectively correspond to the first through fourth conductive lines 112, 114, 116, and 118. In each of the plurality of conductive line groups MG1, MG2, . . . , MG15, and MG16, the first through fourth conductive lines 122, 124, 126, and 128 and the first through fourth pads 132, 134, 136, and 138 may have the same or similar structure and layout.

The plurality of conductive line groups MG1, MG2, . . . , MG15, and MG16 may be distributed in a second direction (or y direction) symmetrically about a first-directional central line Rx disposed in a central portion. The length in the first direction of the plurality of first conductive lines M00, M01, M02, . . . , M61, M62, and M63 may be sequentially reduced with respect to position relative to the central line Rx in the second direction. Specifically, the first-directional length of first conductive lines M00, M01, M02, . . . , M61, M62, and M63 may be reduced the farther away from the central line Rx. In other words, the first-directional lengths of the respective conductive line groups MG1, MG2, . . . , MG15, and MG16 may be sequentially reduced with respect to the distance to the central line Rx.

Each of the plurality of first conductive lines M00, M01, M02, . . . , M61, M62, and M63 may have a uniform width in the memory cell region 1000A and in the connection region 1000B. For example, each of the plurality of first conductive lines M00, M01, M02, . . . , M61, M62, and M63 may have a width 1 F, which may be a minimum feature size of a semiconductor device fabrication process. A uniform minimum interval of 1 F may be maintained between the first conductive lines M00, M01, M02, . . . , M61, M62, and M63.

Although FIG. 3 illustrates that one memory cell block 1050 includes 16 conductive line groups, the present inventive concept is not so limited, and the number of conductive line groups included in one memory cell block 1050 may be naturally greater or smaller than 16.

Each of the string selection line SSL and the ground selection line GSL may have a width of 3 F, which may be greater than the width of each of the plurality of first conductive lines M00, M01, M02, . . . , M61, M62; and M63. A uniform interval of 1 F may be maintained between the ground selection line GSL and an outermost conductive line M00 and between the string selection line SSL and a first conductive line M63. A conductive pattern 700 for a peripheral circuit may be formed in the peripheral circuit region 1000C.

The first conductive line structure 110, that is, the plurality of first conductive lines M00, M01, M02, . . . , M61, M62, and M63, the string selection line SSL, the ground selection line GSL, the second conductive line structure 120, the pad structure 130, and the conductive pattern 700 for the peripheral circuit may be formed of the same material.

For example, the plurality of first conductive lines M00, M01, M02, . . . , M61, M62, and M63 may be word lines constituting a plurality of memory cells. As another example, the plurality of first conductive lines M00, M01, M02, . . . , M61, M62, and M63 may be bit lines constituting a plurality of memory cells in the memory cell region 1000A. In this case, the string selection line SSL and the ground selection line GSL may be omitted. The conductive pattern 700 for the peripheral circuit may constitute a gate electrode of a transistor for the peripheral circuit.

Although the NAND flash memory device is described as an example, the semiconductor device according to the present embodiment is not so limited and many other semiconductor devices and other devices may be included. For example, a dynamic random access memory (DRAM), in which a plurality of conductive lines are disposed and pads are formed at terminals may also benefit from use of the disclosed structure and method.

Figure 4:
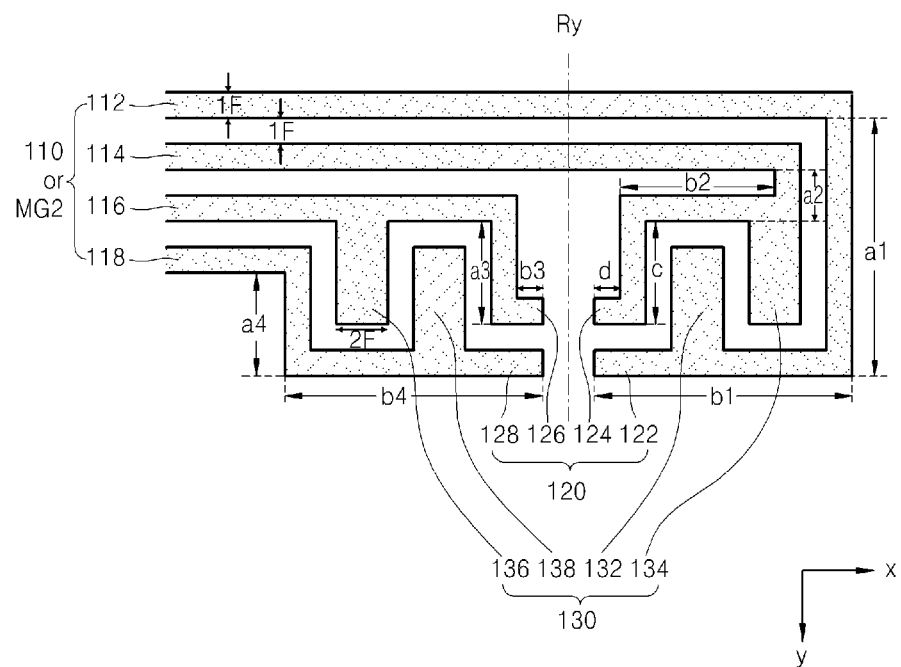
FIG. 4 is a view of a portion A of FIG. 3.

FIG. 4 is a view of a portion A of FIG. 3, which illustrates one of the conductive line groups MG1, MG2, . . . , MG15, and MG16, for example, a right terminal of the conductive line group MG2. The conductive-line group MG2 may include the first conductive line structure 110, the second conductive line structure 120, and the pad structure 130.

The first conductive line structure 110 may include four conductive lines, for example, the first through fourth conductive lines 112, 114, 116, and 118, which may extend in the first direction (or x direction) from the memory cell region (refer to 1000A of FIG. 3) to the connection region 1000B to be parallel to one another. Each of the first through fourth conductive lines 112, 114, 116, and 118 may have a width of 1 F, and a minimum interval of 1 F may be maintained between first through fourth conductive lines 112, 114, 116, and 118 of the first conductive line structure 110.

The first-directional length of the individual lines 112-118 of the first conductive line structure 110 may be sequentially reduced in the second direction. For example, in the first conductive line structure 110, the first conductive line 112 may be the conductive line with the longest extent in the first direction, the second conductive line 114 may have the second longest extent, the third conductive line 116 may be the third longest, and the fourth conductive line 118 may be the shortest conductive line.

The second conductive line structure 120 may include four conductive lines, for example, the first through fourth conductive lines 122, 124, 126, and 128. The first through fourth conductive lines 122, 124, 126, and 128 of the second conductive line structure 120 may be branched from the corresponding first through fourth conductive lines 112, 114, 116, and 118 of the first conductive line structure 110 in the second direction (or y direction). Each of the first through fourth conductive lines 122, 124, 126, and 128 of the second conductive line structure 120 may have a width of 1 F. The first conductive line 122 of the second conductive line structure 120 may include a first portion (1-1) a1 and a second portion (1-2) b1. The first portion a1 may extend in the second direction downward from an end of the first conductive line 122 of the first conductive line structure 110, and the second portion b1 may extend in the first direction leftward from an end of the first portion a1. The second conductive line 124 of the second conductive line structure 120 may include a first portion (2-1) a2, a second portion (2-2) b2, a third portion (2-3) c, and a fourth portion (2-4) d. The first portion a2 may extend in the second direction downward from and end of the second conductive line 114 of the first conductive line structure 110, the second portion b2 may extend in the first direction leftward from an end of the second portion a2, the third portion c may extend in the second direction downward from an end of the second portion b2, and the fourth portion d may extend in the first direction leftward from an end of the third portion c. The third conductive line 126 of the second conductive line structure 120 may include a first portion (3-1) a3 and a second portion (3-2) b3. The first portion a3 may extend in the second direction downward from an end of the third conductive line 116 of the first conductive line structure 110, and the second portion b3 may extend in the first direction rightward from an end of the first portion a3. The fourth conductive line 128 of the second conductive line structure 120 may include a first portion (4-1) a4 and a second portion (4-2) b4. The first portion a4 may extend in the second direction downward from an end of the fourth conductive line 118 of the first conductive line structure 110, and the second portion b4 may extend in the first direction rightward from an end of the first portion a4.

Each of the first through fourth conductive lines 122, 124, 126, and 128 of the second conductive line structure 120 may be disposed an interval of 1 F apart from any one of other adjacent conductive lines, for example, the first through fourth conductive lines 112, 114, 116, and 118 of the first conductive line structure 110, the first through fourth conductive lines 122, 124, 126, and 128 of the second conductive line structure 120, and the first through fourth pads 132, 134, 136, and 138. To maintain the interval of 1 F, the first through fourth conductive lines 122, 124, 126, and 128 of the second conductive line structure 120 may have different structures and lengths. The third and fourth portions c and d of the second conductive line 124 of the second conductive line structure 120 and the first and second portions a3 and b3 of the third conductive line 126 of the second conductive line structure 120 may not be formed according to circumstances.

The pad structure 130 may include four pads, that is, the first through fourth pads 132, 134, 136, and 138. Each of the first through fourth pads 132, 134, 136, and 138 may have a rectangular structure protruding from the first conductive line structure 110 or the second conductive line structure 120 and be electrically connected to the corresponding one of the first through fourth conductive lines 112, 114, 116, and 118 of the first conductive line structure 110. The first-directional width of each of the first through fourth pads 132, 134, 136, and 138 may be 2 F, which is equal to twice the width of each of the first through fourth conductive lines 112, 114, 116, and 118 of the first conductive line structure 110.

Specifically, the first pad 132 may protrude in the second direction upward from the second portion b1 of the first conductive line 122 of the second conductive line structure 120. The second pad 134 may protrude in the second direction downward from the second portion b2 of the second conductive line 124 of the second conductive line structure 120. The third pad 136 may protrude in the second direction downward from the third conductive line 116 of the first conductive line structure 110. The fourth pad 138 may protrude in the second direction upward from the second portion b4 of the fourth conductive line 128 of the second conductive line structure 120. Each of the adjacent first through fourth pads 132, 134, 136, and 138 of the pad structure 130 may be disposed an interval of 1 F apart from any one of other conductive lines, for example, the first through fourth conductive lines 112, 114, 116, and 118 of the first conductive line structure 110, the first through fourth conductive lines 122, 124, 126, and 128 of the second conductive line structure 120, and the first through fourth pads 132, 134, 136, and 138 of the pad structure 130.

Each pair of pads of the first through fourth pads 132, 134, 136, and 138 may be symmetrical to each other about a second-directional central line Ry in the corresponding group. For example, the first and fourth pads 132 and 138 may be symmetrical to each other about the central line Ry, and the second and third pads 134 and 136 may be symmetrical to each other about the central line Ry. The first and second pads 132 and 134 may protrude in opposite directions to each other, and the third and fourth pads 136 and 138 may be protrude in opposite directions to each other.

In the present embodiment, the first conductive line structure 110, the second conductive line structure 120, and the pad structure 130 may be formed at the same time by applying a double patterning technology (DPT) process to a mask pattern with a selected shape, which may be embodied using the current lithography technique.

Forming the first conductive line structure 110, the second conductive line structure 120, and the pad structure 130 according to the present embodiment, may involve a mask pattern be initially formed using a photolithography process. The structure of the illustrative mask pattern will be described in more detail later in a description of a method of forming a pattern with reference to FIGS. 5A through 14.

In the present described embodiment, the second conductive line structure 120 and the pad structure 130 extend or protrude from the first conductive line structure 110 in a direction vertical to the first direction, that is, downward in the second direction. However, the first and second conductive line structures 110 and 120 and the pad structure 130 are not so limited, and may have various structures within the scope of the inventive concept. For example, the second conductive line structure 120 and the pad structure 130 may be formed over the first-directional central line Rx. Alternatively, the second conductive line structure 120 and the pad structure 130 may be formed to have the structures shown in FIG. 18B.

FIGS. 5A through 14 are plane views and cross-sectional views illustrating methods of forming a semiconductor pattern of FIG. 3, according to various exemplary embodiments. FIGS. 5A, 6A, 7A, 8A, 9A, 10A, 11A, 12A, 13A, and 14 are plane views illustrating respective operations of a method of forming patterns of a semiconductor device according to the present embodiment. FIGS. 5B, 6B, 7B, 8B, 9B, 10B, 11B, 12B, and 13B are cross-sectional views taken along lines I-I of FIGS. 5A, 6A, 7A, 8A, 9A, 10A, 11A, 12A, and 13A, respectively. FIGS. 5C, 6C, 7C, 8C, 9C, 10C, 11C, 12C, and 13C are cross-sectional views taken along lines II-II of FIGS. 5A, 6A, 7A, 8A, 9A, 10A, 11A, 12A, and 13A, respectively.

Figure 5B:
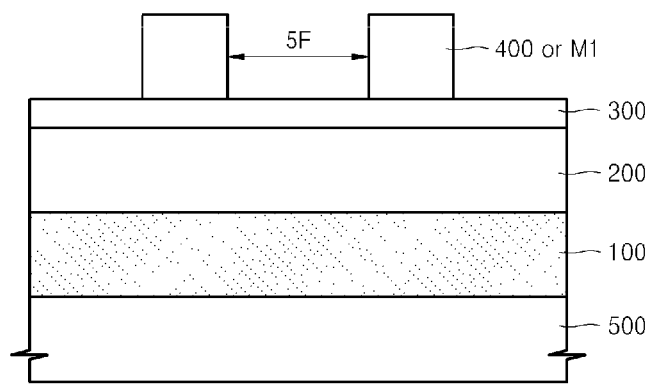
FIGS. 5A through 14 are plane views and cross-sectional views illustrating a method of foaming a semiconductor pattern of FIG. 3, according to other exemplary embodiments of the inventive concept.
Figure 5C:
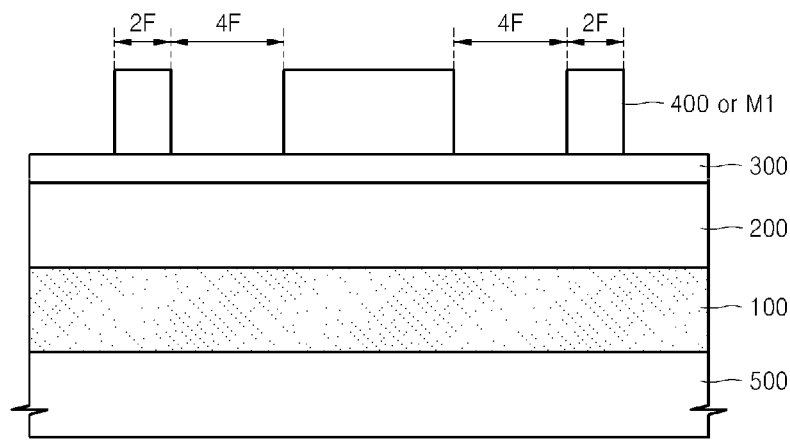

Referring to FIGS. 5A through 5C, a conductive layer 100, an insulating layer 200, and an anti-reflective coating (ARC) layer 300 may be formed in the order stated on a substrate 500, and a photoresist (PR) pattern 400 having a selected shape may be formed on the ARC layer 300.

The substrate 500 may include a semiconductor substrate, for example, a Group IV semiconductor substrate, a Group III-V compound semiconductor substrate, or a Group II-VI oxide semiconductor substrate. For example, the Group IV semiconductor substrate may include a Si substrate, a Ge substrate, or a SiGe substrate. The substrate may include a bulk wafer or an epitaxial layer.

FIGS. 5A through 5C illustrate a portion of the memory cell region 1000A and the connection region 1000B. A plurality of active regions, isolation layers, conductive layers 100, and insulating layers 200 may be formed on the substrate 500.

The conductive layer 100 may be a layer where a target conductive line or pad will be formed. The conductive layer 100 may be formed of a doped polysilicon (poly-Si), a metal, a metal nitride, or a combination thereof. For example, when the conductive layer 100 forms a word line, the conductive layer 100 may include a conductive material formed of one selected from the group consisting of TaN, TiN, W, WN, HfN, tungsten silicide, poly-Si, and a combination thereof. Alternatively, when the conductive layer 100 forms a bit line, the conductive layer 100 may include doped poly-Si or a metal.

The insulating layer 200 may be a hard mask layer formed as a single layer or a plurality of layers. For example, when the insulating layer 200 is formed as the plurality of layers, the insulating layer 200 may have a stack structure of at least two hard mask layers having different etching characteristics under selected etching conditions. The insulating layer 200 may be formed of materials that may be easily removed using ashing and stripping processes. For example, the insulating layer 200 may be formed of a PR layer, an amorphous carbon layer (ACL), or a layer (hereinafter, "C-SOH layer") formed of a hydrocarbon compound or a derivative thereof, which may contain 85 to 99% by weight of carbon (C) based on the total weight of the insulating layer 200.

When the insulating layer 200 is formed of a C-SOH layer, an organic compound layer may be formed to a thickness of about 1000 to 5000 Å on the conductive layer 100 using a spin coating process or another deposition process. The organic compound layer may be formed of a hydrocarbon compound or a derivative thereof, which may contain aromatic rings, such as phenyl rings, benzene rings, or naphthalene rings. The organic compound layer may be primarily baked at a temperature of about 150 to 350° C., thereby forming a C-containing layer. The primary bake process may be performed for about 60 seconds. Afterwards, the C-containing layer may be secondarily baked at a temperature of about 300 to 550° C. and cured, thereby forming a C-SOH layer. The secondary bake process may be performed for about 30 to 300 seconds. By curing, the C-containing layer using the secondary bake process, even if a layer having a different film quality is deposited on the cured C-containing layer (or C-SOH layer) at a relatively high temperature of about 400° C. or higher, the C-SOH layer may not be adversely affected during the deposition process.

The ARC layer 300 may be a single or plurality of layers configured to perform an anti-reflection function during a photolithography process. When the ARC layer 300 is formed of the single layer, the single layer may be, for example, a SiON layer. When the ARC layer 300 is formed of the plurality of layers, an organic ARC layer (not shown) may be further formed on the SiON layer.

A plurality of PR patterns 400, which may function as first mask layers M1, may be formed in a selected shape on the ARC layer 300 using a photolithography process. Each of the PR patterns 400 may be formed to a selected standard as shown in FIG. 5A.

Specifically, the PR pattern 400 may include a first region 410 configured to extend in a first direction (or x direction) and having a second-directional (or y-directional) width 3 F and a second region 420 branched from the first region 410 in the second direction. The second region 420 may include first through third protrusions 422, 424, and 426, which may protrude from the first region 410.

The second region 420 will now be described in more detail. The first through third protrusions 422, 424, and 426, each of which may protrude in a rectangular shape in the second direction downward from a side of the first region 410, may be spaced apart from one another. Each of the first and third protrusions 422 and 426 may be spaced an interval 4 F apart from the central second protrusion 424 in the first direction, and each of the first and third protrusions 422 and 426 may have a first-directional width of 2 F.

For reference, although the first-directional width of the second protrusion 424 is not limited, the second protrusion 424 may be formed to a first-directional width greater than 2 F to facilitate deposition of an oxide layer functioning as the second spacer layer (refer to 700 of FIGS. 10A through 10C) having a thickness approximately equal to 1 F after subsequent removal of a PR pattern. Although the second-directional length of each of the first through third protrusions 422, 424, and 426 is not limited, each of the first through third protrusions 422, 424, and 426 may be formed to a selected length in consideration of connection of each of the first through third protrusions 422, 424, and 426 with a subsequent metal contact formed on a pad.

An interval between adjacent PR patterns 400 may be 5 F. That is, an interval between first regions 410 included in each of the PR patterns 400 may be 5 F. Positions of the second regions 420 of the respective PR patterns 400 may be different. Specifically, to form the first through fourth conductive lines 112, 114, 116, 118, 122, 124, 126, and 128 and the first through fourth pads 132, 134, 136, and 138, the lengths of the first regions 410 may be sequentially increased or reduced in the second direction. Thus, the second regions 420 of the PR patterns 400 also may be sequentially disposed more outward or inward from the first direction in the second direction. The first protrusion 422 of one PR pattern 400 may be formed a sufficient first-directional distance apart from the third protrusion 426 of another adjacent PR pattern 400 to prevent the second conductive line structure 120 from overlapping with another second conductive line structure 120, which may be formed based on the adjacent PR patterns 400.

In addition, when the ARC layer 300 includes an organic ARC layer (not shown) disposed on the SiON layer, the formation of the PR pattern 400 may include a photolithography process and a process of etching the organic ARC layer. When a desired pitch is not adjusted due to an after-develop inspection (ADI) limit, a PR trimming process may be further carried out.

Figure 6B:
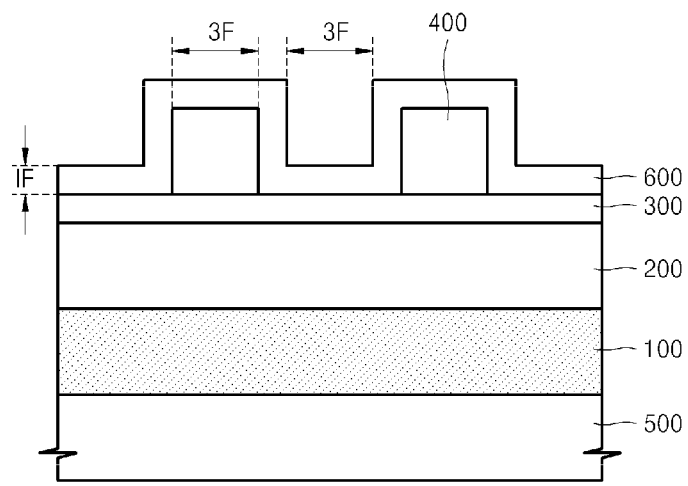
Figure 6C:
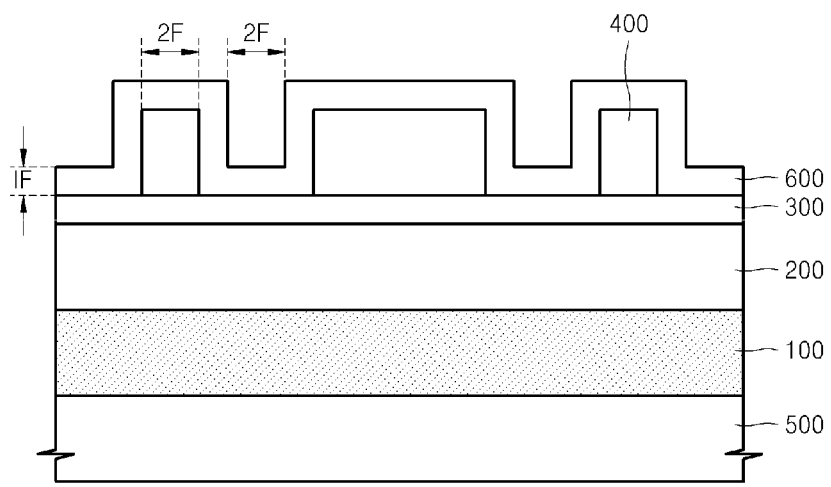

Referring to FIGS. 6A through 6C, a first spacer layer 600 may be formed on a PR pattern 400 and an ARC layer 300. The first spacer layer 600 may be formed to a uniform thickness, for example, to the same thickness equal to a target width 1 F of a first conductive line structure. The first spacer layer 600 may be formed of a material having an etch selectivity with respect to the PR pattern 400. For example, the first spacer layer 600 may be formed of an oxide layer, such as a medium-temperature-oxide (MTO) layer.

The first spacer layer 600 may be formed to a uniform thickness using an atomic layer deposition (ALD) process. In particular, the ALD process for forming the first spacer layer 600 may be performed at a temperature ranging from room temperature to about 75° C. or lower.

After forming the first spacer layer 600, grooves H1 of the first spacer layer 600, which may extend in the first direction between adjacent PR patterns 400, may be spaced a distance of 3 F apart from one another. Grooves of the first spacer layer 600, which may be formed between the first through third protrusions 422, 424, and 426 of the PR patterns 400, may be spaced a distance of 2 F apart from one another.

Figure 7A:
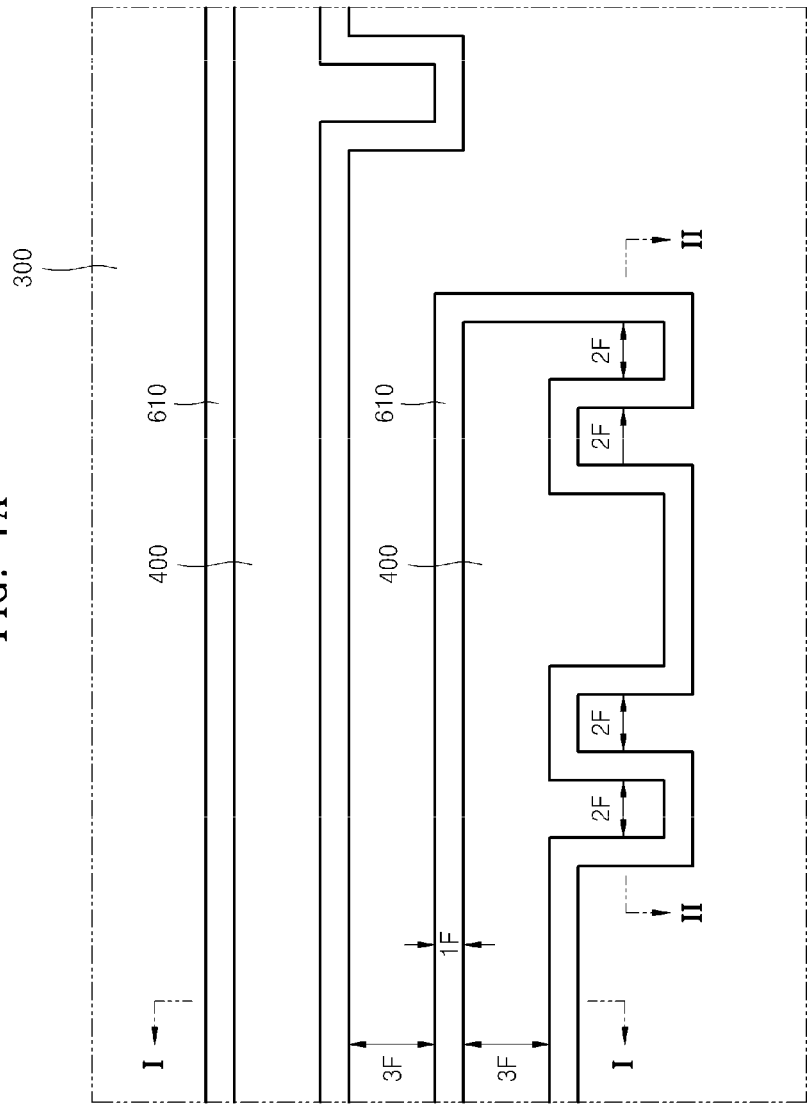
Figure 7B:
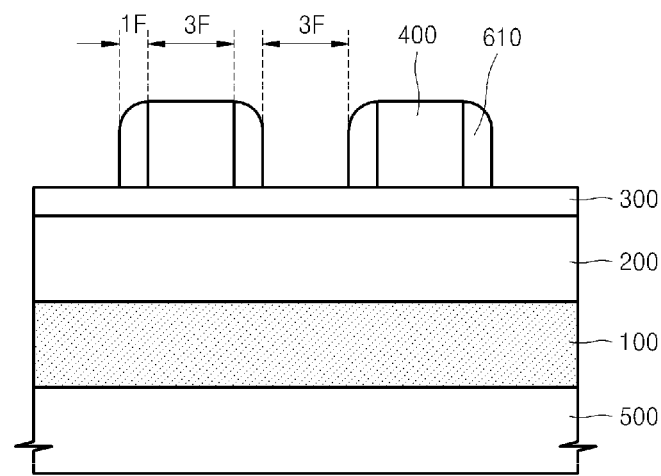
Figure 7C:
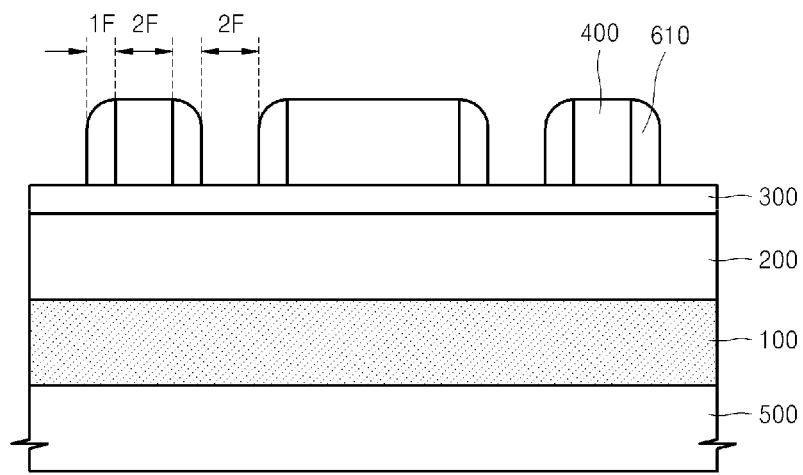

Referring to FIGS. 7A through 7C, the first spacer layer 600 may be etched back until the top surface of the ARC layer 300 is exposed, thereby forming a first spacer 610 covering a sidewall of the PR pattern 400.

As shown in FIG. 7A, the first spacer 610 may surround the entire sidewall of the PR pattern 400. As shown in FIGS. 7B and 7C, the first spacer 610 may be formed to a width 1 F covering the top surface of the ARC layer 300

The etching of the first spacer layer 600 may be performed using, for example, $C_xF_y$ gas (each of x and y is an integer ranging from 1 to 10) or $CH_xF_y$ gas (each of x and y is an integer ranging from 1 to 10) as a main etching gas. Alternatively, the etching of the first spacer layer 600 may be performed using a mixture of the main etching gas with at least one gas selected out of $O_2$ gas and Ar gas. The $C_xF_y$ gas may be, for example, $C_3F_6$ gas, $C_4F_6$ gas, $C_4F_8$ gas, or $C_5F_8$ gas. The $CH_xF_y$ gas may be, for example, $CHF_3$ gas or $CH_2F_2$ gas. In this case, the $O_2$ gas added to the main etching gas may remove polymer by-products generated during an etching process and decompose the $C_xF_y$ etching gas. Ar gas added to the main etching gas may be used as a carrier gas and cause ion bombarding.

The etching of the first spacer layer 600 may include generating plasma of an etching gas selected out of the above-described etching gases in an etching chamber and performing an etching process in a plasma atmosphere. Alternatively, in some cases, the etching of the first spacer layer 600 may be performed in the atmosphere of a selected etching gas free from ion energy without generating plasma in the etching chamber. For example, the etching of the first spacer layer 600 may be performed using a mixture gas of $C_4F_6$, $CHF_3$, $O_2$, and Ar as an etching gas. In this case, by supplying $C_4F_6$, $CHF_3$, $O_2$, and Ar gases in a volume ratio of about 1:6:2:14, a plasma dry etching process may be performed under a pressure of about 30 mT for several to several tens of seconds.

Figure 8A:
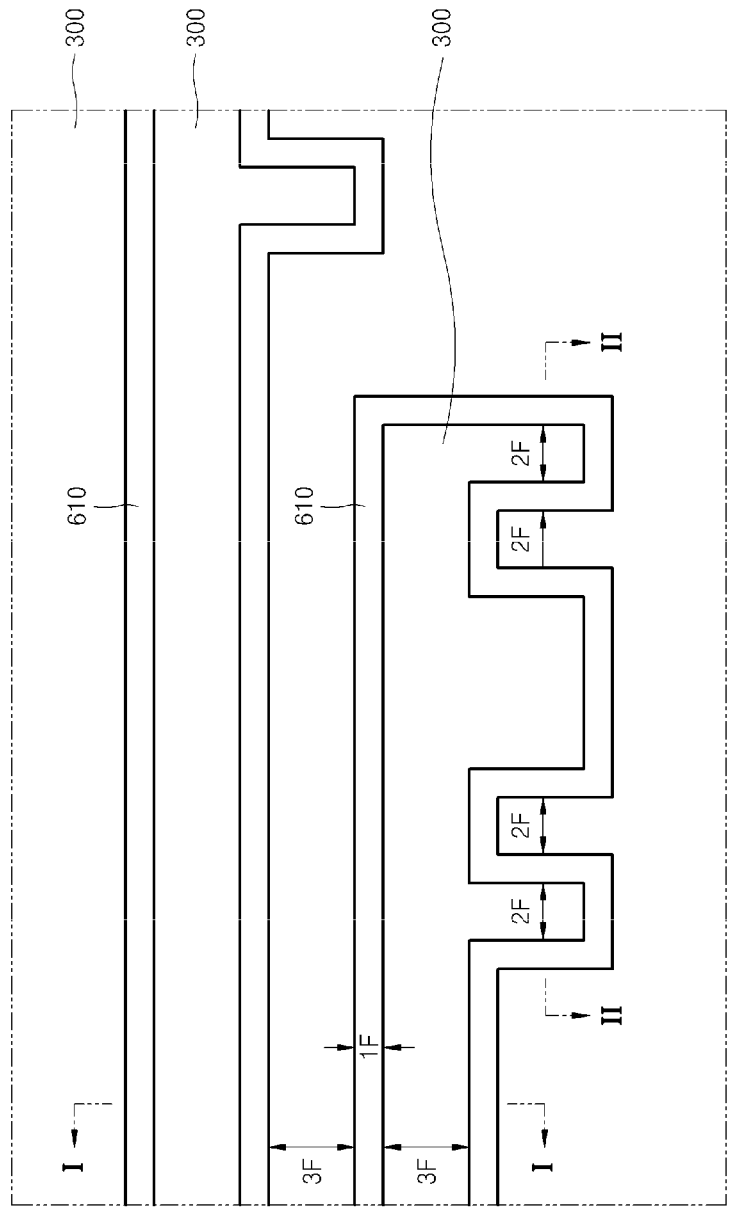
Figure 8B:
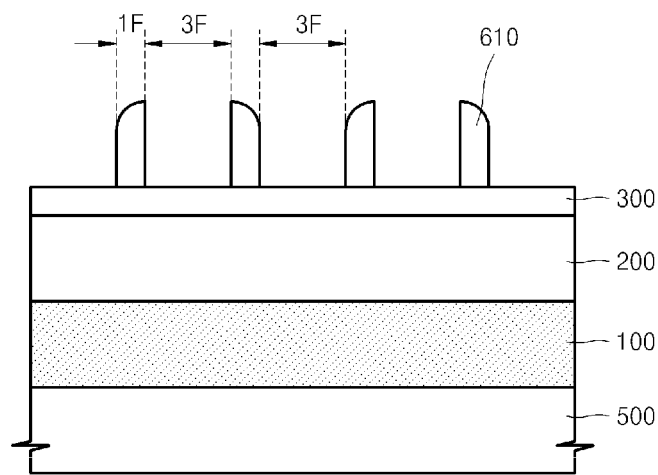
Figure 8C:
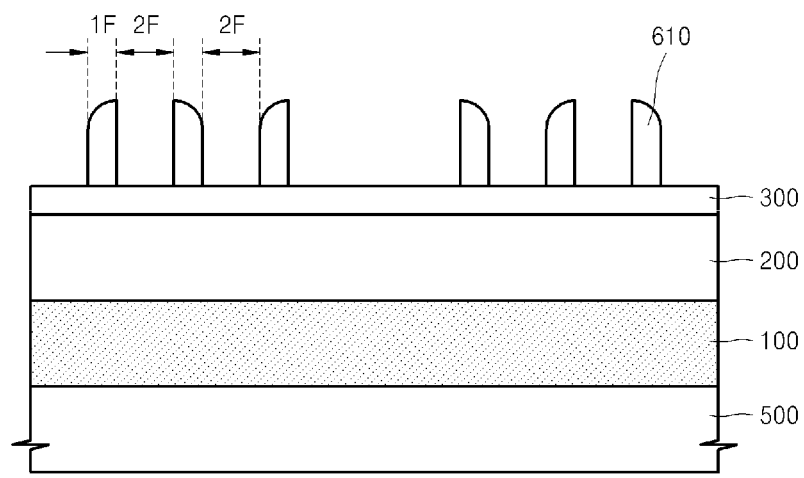

Referring to FIGS. 8A through 8C, the PR pattern 400 may be removed from the ARC layer 300 to leave only the first spacer 610.

The removal of the PR pattern 400 may be performed under such conditions as to inhibit the etching of the first spacer 610 and the ARC layer 300. The removal of the PR pattern 400 may be performed using, for example, ashing and stripping processes. Alternatively, the PR pattern 400 may be removed using a dry or wet etching process according to a material of the ARC layer 300.

Figure 9B:
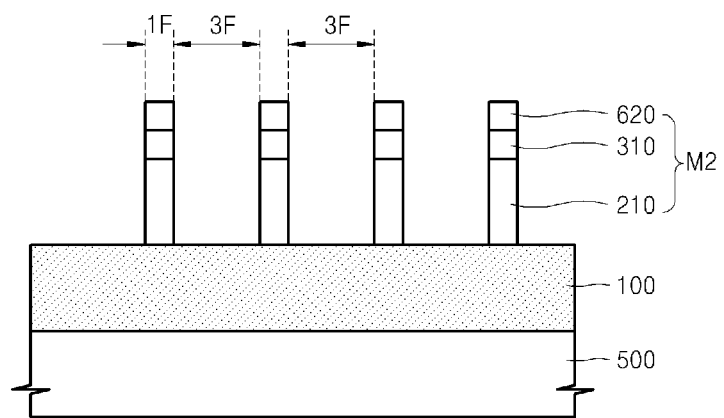
Figure 9C:
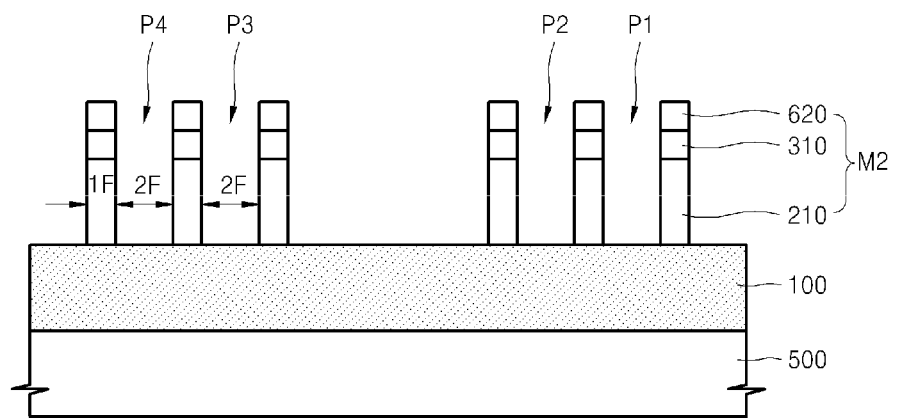

Referring to FIGS. 9A through 9C, the ARC layer 300 and the insulating layer 200 may be dry etched using the first spacer 610 as an etch mask, thereby forming a second mask layer M2 having a width 1 F. Due to the formation of the second mask layer M2, a top surface of the conductive layer 100 may be partially exposed.

The second mask layer M2 may include an insulating pattern 210, an ARC pattern 310, and a partial first spacer 620. Since the insulating pattern 210 and the ARC pattern 310 are aimed using the first spacer 610 as an etch mask, the insulating pattern 210 and the ARC pattern 310 may have the same horizontal sectional structure as the first spacer 610. Since an upper portion of the partial first spacer 620 is etched during a dry etching process, the partial first spacer 620 may be thinner than the first spacer 610. In some cases, the first spacer 610 may be completely etched, or an upper portion of the ARC pattern 310 may be removed by etching.

The second mask layer M2 may be formed to a width of 1 F so that a horizontal section of the second mask layer M2 can surround the same space as the PR pattern 400. Thus, a space of the second mask layer M2 corresponding to the first region 410 of the PR pattern 400 may have an interval of 3 F, and each of the spaces of the second mask layer M2 corresponding to the first and third protrusions 422 and 426 of the PR pattern 400 may have an interval of 2 F. Each of the spaces of the second mask layer M2 between the first and second protrusions 422 and 424 of the PR pattern 400 and between the second and third protrusions 424 and 426 of the PR pattern 400 may have an interval of 2 F.

Hereinafter, the space of the second mask layer M2 corresponding to the first protrusion 422 will be referred to as a first pad region P1, the space of the second mask layer M2 between the first and second protrusions 422 and 424 will be referred to as a second pad region P2, a space of the second mask layer M2 between the second and third protrusions 424 and 426 will be referred to as a third pad region P3, and a space of the second mask layer M2 corresponding to the third protrusion 426 will be referred to as a fourth pad region P4. In FIG. 9A, the first through fourth pad regions P1, P2, P3, and P4 are illustrated with rectangular bold dash-dot lines. A plurality of second mask layers M2 corresponding to the plurality of PR patterns 400 may be formed, and adjacent second mask layers M2 may be disposed at an interval of 3 F.

Figure 10A:
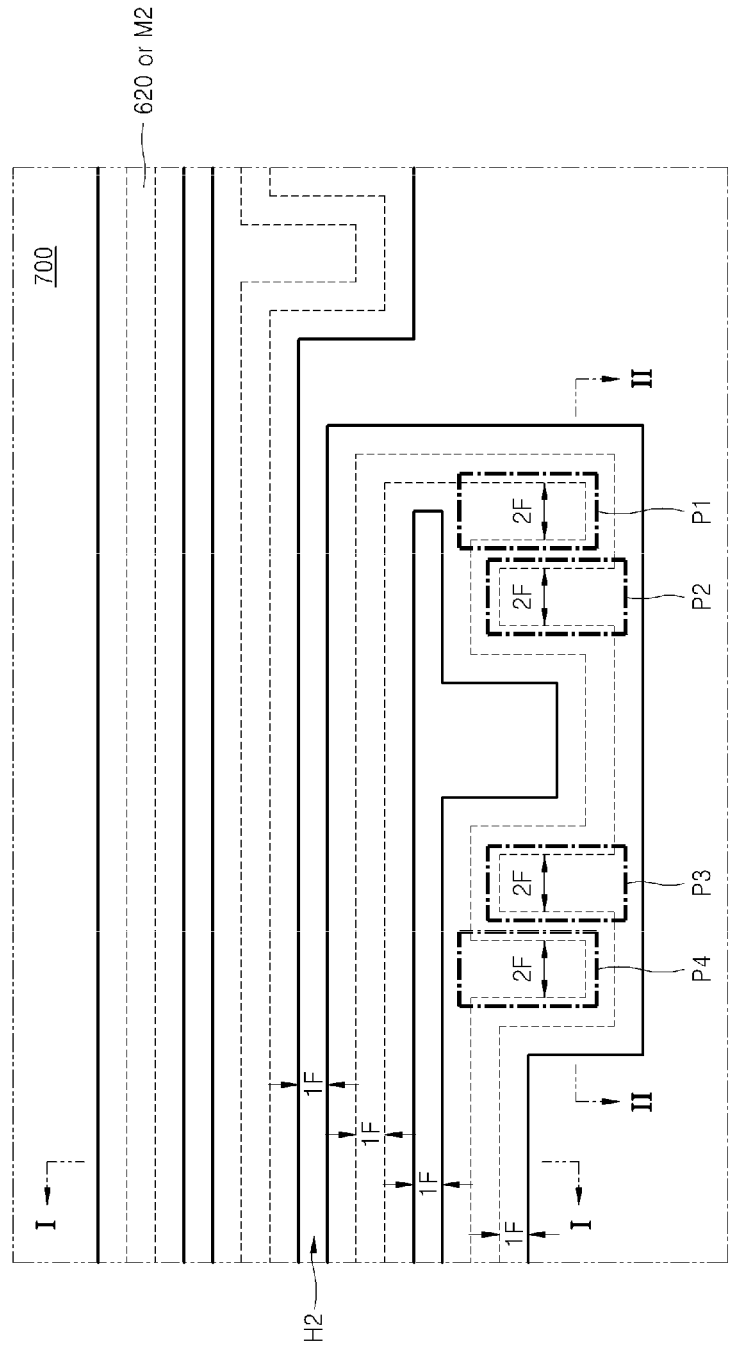
Figure 10B:
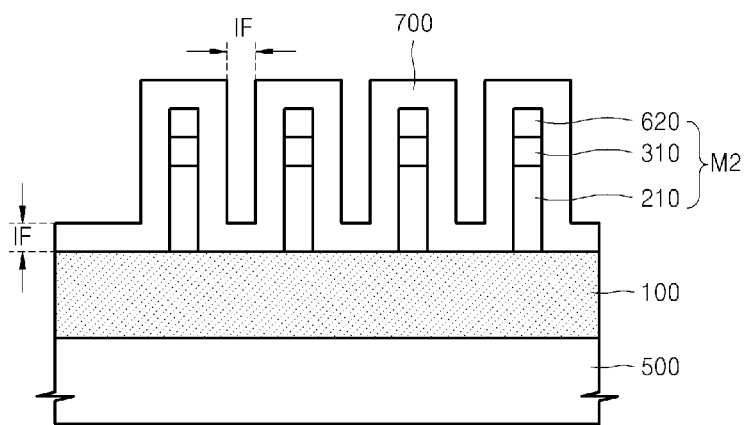
Figure 10C:
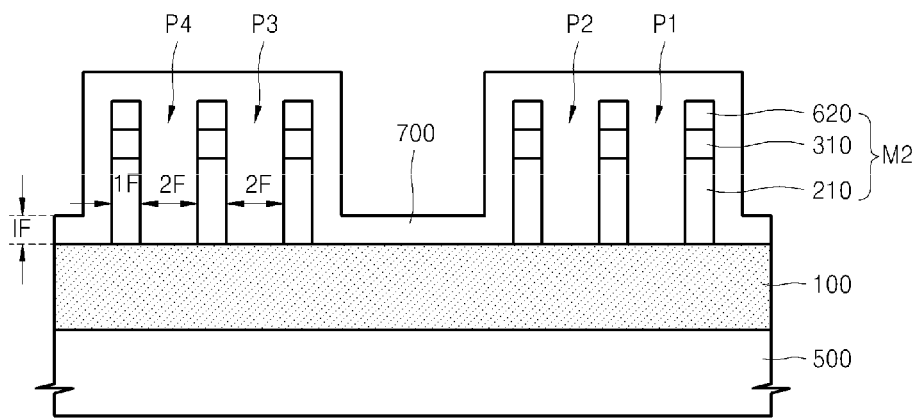

Referring to FIGS. 10A through 10C, a second spacer layer 700 may be formed on the second mask layer M2 and the conductive layer 100. The second spacer layer 700 may be formed to a uniform thickness, for example, to the same thickness 1 F as the first spacer layer 600. The second spacer layer 700 may be formed of a material having an etch selectivity with respect to the second mask layers M2. Since the second mask layer M2 has a plurality of layers, the second spacer layer 700 may be formed of materials having etch selectivities with respect to all the layers of the second mask layers M2. However, since the insulating pattern 210 is substantially to be removed using an ashing or stripping process, the second spacer layer 700 may be formed of a material having an etch selectivity with respect to only the insulating pattern 210. For example, the second spacer layer 700 may be formed of an oxide layer, such as an MTO layer.

Like the first spacer layer 600, the second spacer layer 700 may be formed to a uniform thickness using an ALD process. ALD processes for forming the second spacer layer 700 may be performed at a temperature ranging from room temperature to about 75° C. or lower.

As shown in FIGS. 10A and 10B, after forming the second spacer layer 700, the first through fourth pad regions P1, P2, P3, and P4 may be completely filled with the second spacer layer 700. That is, before forming the second spacer layer 700, a first-directional interval of the first through fourth pad regions P1, P2, P3, and P4 may be 2 F, and the second spacer layer 700 may be deposited to a thickness of 1 F. Thus, the second spacer layer 700 may be folded in the first through fourth pad regions P1, P2, P3, and P4 so that the first through fourth pad regions P1, P2, P3, and P4 can be completely filled with the second spacer layer 700.

As shown in FIGS. 10A and 10B, grooves H2 of the second spacer layer 700, which may extend in the first direction, may be formed at an interval of 1 F between the first region 410 and the PR patterns 400.

Figure 11A:
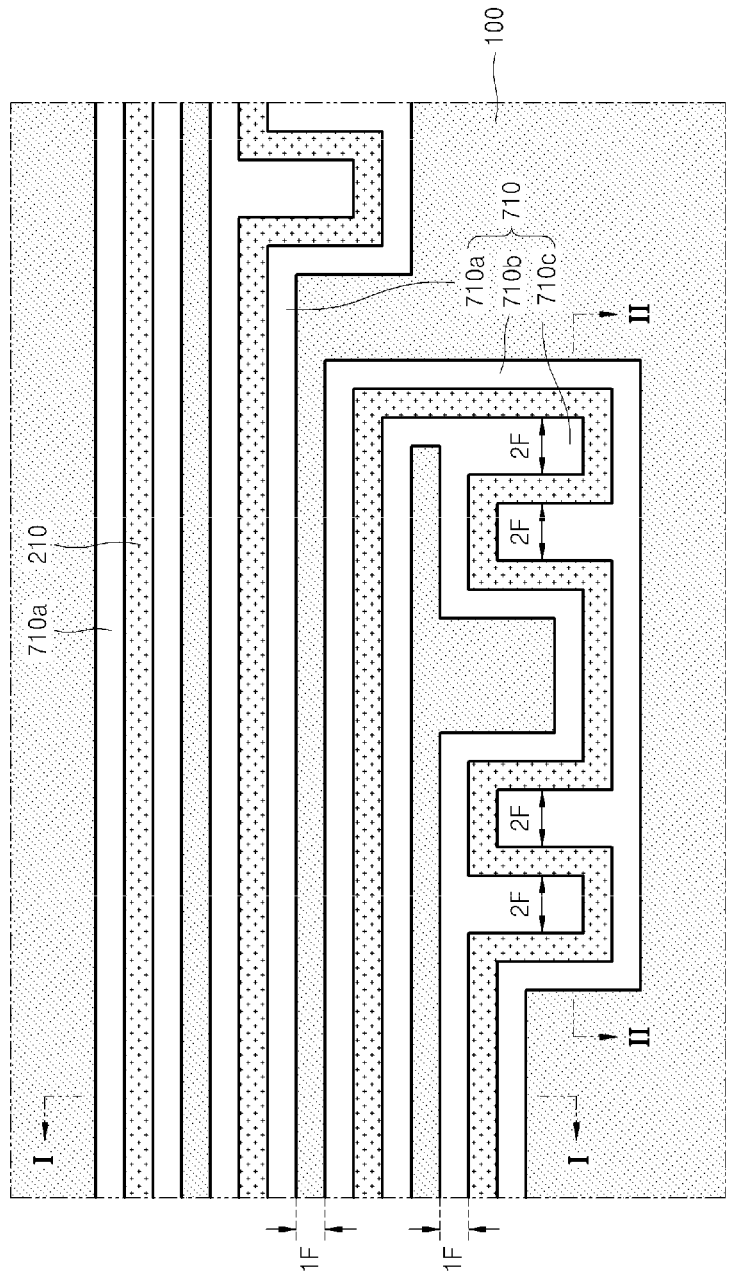
Figure 11B:
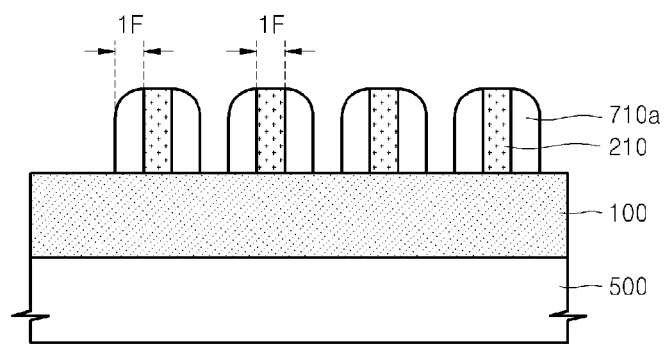
Figure 11C:
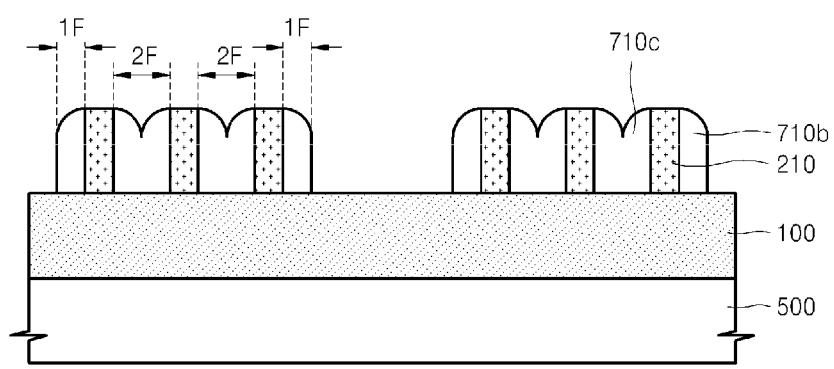

Referring to FIGS. 11A through 11C, the second spacer layer 700 may be etched back until the top surface of the conductive layer 100 is exposed, thereby forming a second spacer structure 710 covering a sidewall of the insulating pattern 210. The second spacer structure 710 may include a first spacer 710a configured to extend in the first direction, a second spacer 710b branched from the first spacer 710a of the second spacer structure 710, and a third spacer 710c formed in the first through fourth pad regions P1, P2, P3, and P4.

As shown in FIG. 11A, the second spacer structure 710 may surround the entire sidewall of the insulating pattern 210. As shown in FIGS. 11B and 11C, the second spacer structure 710 may be formed to a width 1 F to cover the top surface of the conductive layer 100.

In FIGS. 11B and 11C, after the etchback process, the second spacer structure 710 may be formed not on the entire second mask layer M1 but on the sidewall of the insulating pattern 210, and the ARC pattern 310 and the partial first spacer 620 on the insulating pattern 210, may be removed using an etchback process. Since the second spacer layer 700 is formed of a material having an etch selectivity with respect to only the insulating pattern 210, the ARC pattern 310 and the partial first spacer 620 may be removed by etching during the etchback process.

Since a process of etching the second spacer layer 700 is similar to the process of etching the first spacer layer 600 described with reference to FIGS. 7A through 7C, a detailed description thereof will be omitted here.

Figure 12A:
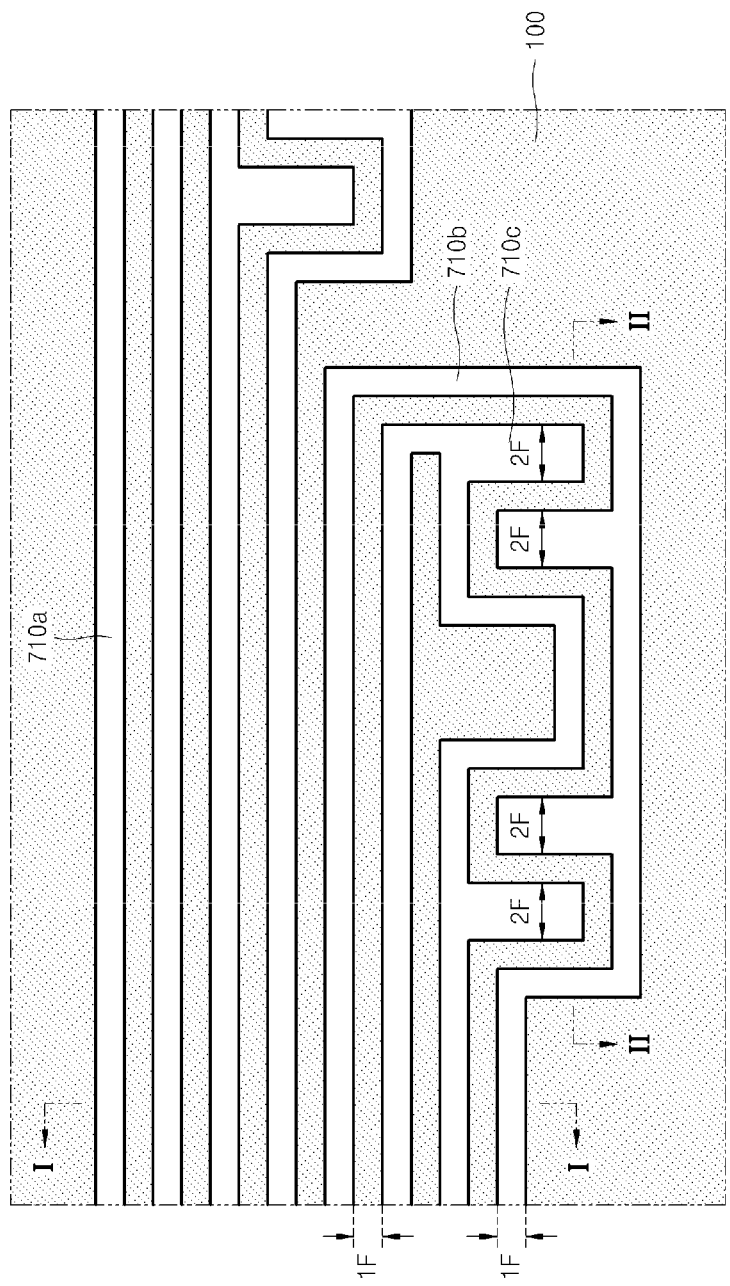
Figure 12B:
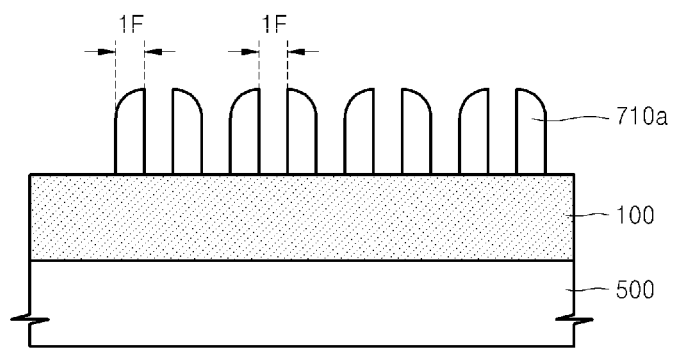
Figure 12C:
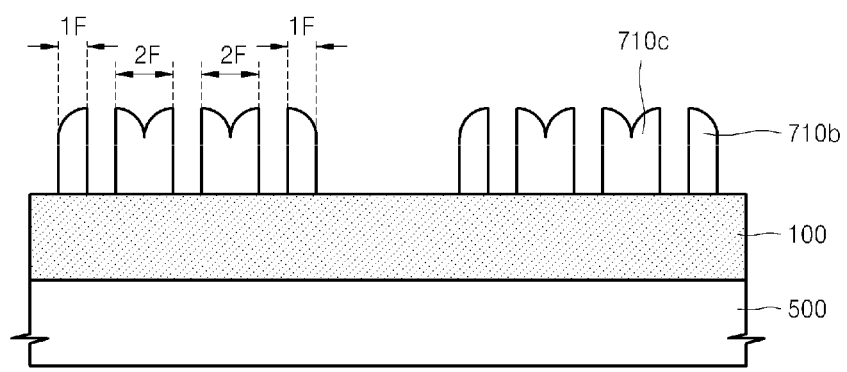

Referring to FIGS. 12A through 12C, the insulating pattern 210 may be removed from the conductive layer 100 to leave only the second spacer structure 710.

The removal of the insulating pattern 210 may be performed under such conditions as to inhibit the etching of the second spacer structure 710 and the conductive layer 100. The removal of the insulating pattern 210 may be performed using, for example, ashing and stripping processes. Alternatively, the insulating pattern 210 may be removed using a dry or wet etching process according to a material of the conductive layer 100.

As stated above, the second spacer structure 710 may include the first spacer 710a, the second spacer 710b, and the third spacer 710c. The first spacer 710a of the second spacer structure 710 may have a width of 1 F, and an interval between adjacent first spacers 710a may be 1 F. The second spacer 710b of the second spacer structure 710 may have a width of 1 F, and the third spacer 710c of the second spacer structure 710 may have a width of 2 F.

Figure 13B:
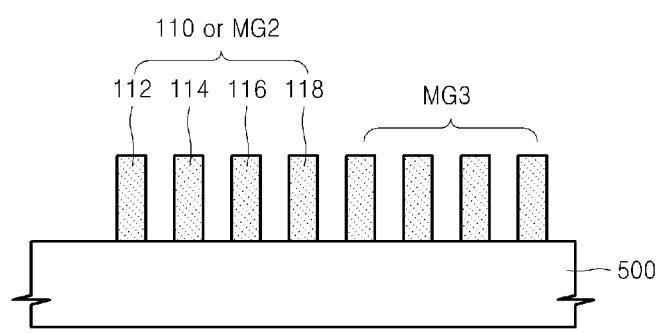
Figure 13C:
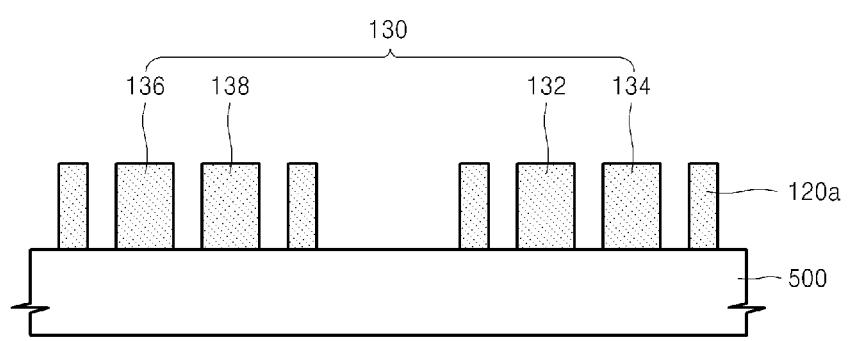

Referring to FIGS. 13A through 13C, the conductive layer 100 may be dry etched using the second spacer structure 710 as an etch mask, thereby forming first and second conductive line structures 110 and 120 and a pad structure 130. Each of the first and second conductive line structures 110 and 120 may have a width of 1 F, and the pad structure 130 may have a width of 2 F. By dry etching the conductive layer 100, a top surface of the substrate 500 may be partially exposed.

The first conductive line structure 110 may extend in the first direction, and an interval between adjacent ones of first through fourth conductive lines 112, 114, 116, and 118 with a width of 1 F may be 1 F. Each of the first through fourth conductive lines 122, 124, 126, and 128 may be branched from the corresponding one of the first through fourth conductive lines 112, 114, 116, and 118 of the first conductive line structure 110 and have a width of 1 F. Each of the first through fourth pads 132, 134, 136, and 138 of the pad structure 130 may protrude toward the first conductive line structure 110 or the second conductive line structure 120 and have a width of 2 F.

As stated above, the first through fourth conductive lines 112, 114, 116, and 118 of the first conductive line structure 110, the first through fourth conductive lines 122, 124, 126, and 128 of the second conductive line structure 120, and the first through fourth pads 132, 134, 136, and 138 may constitute a single conductive line group. The first through fourth pads 132, 134, 136, and 138 may be directly connected to first through fourth conductive lines 112, 114, 116, and 118 of the first conductive line structure 110 or indirectly connected to first through fourth conductive lines 112, 114, 116, and 118 of the first conductive line structure 110 through the second conductive line structure 120.

In addition, in the current method operation, the first and second conductive lines 112 and 114 may be respectively connected to the fourth and third conductive lines 118 and 116 through a second conductive line structure 120a. Thus, the first and second pads 132 and 134 may be connected to the fourth and third pads 138 and 136, respectively. Accordingly, in a subsequent process, the first through fourth conductive lines 112, 114, 116, and 118 of the first conductive line structure 110 may be separated from one another, and the first through fourth pads 132, 134, 136, and 138 corresponding thereto may be separated from one another.

Figure 14:
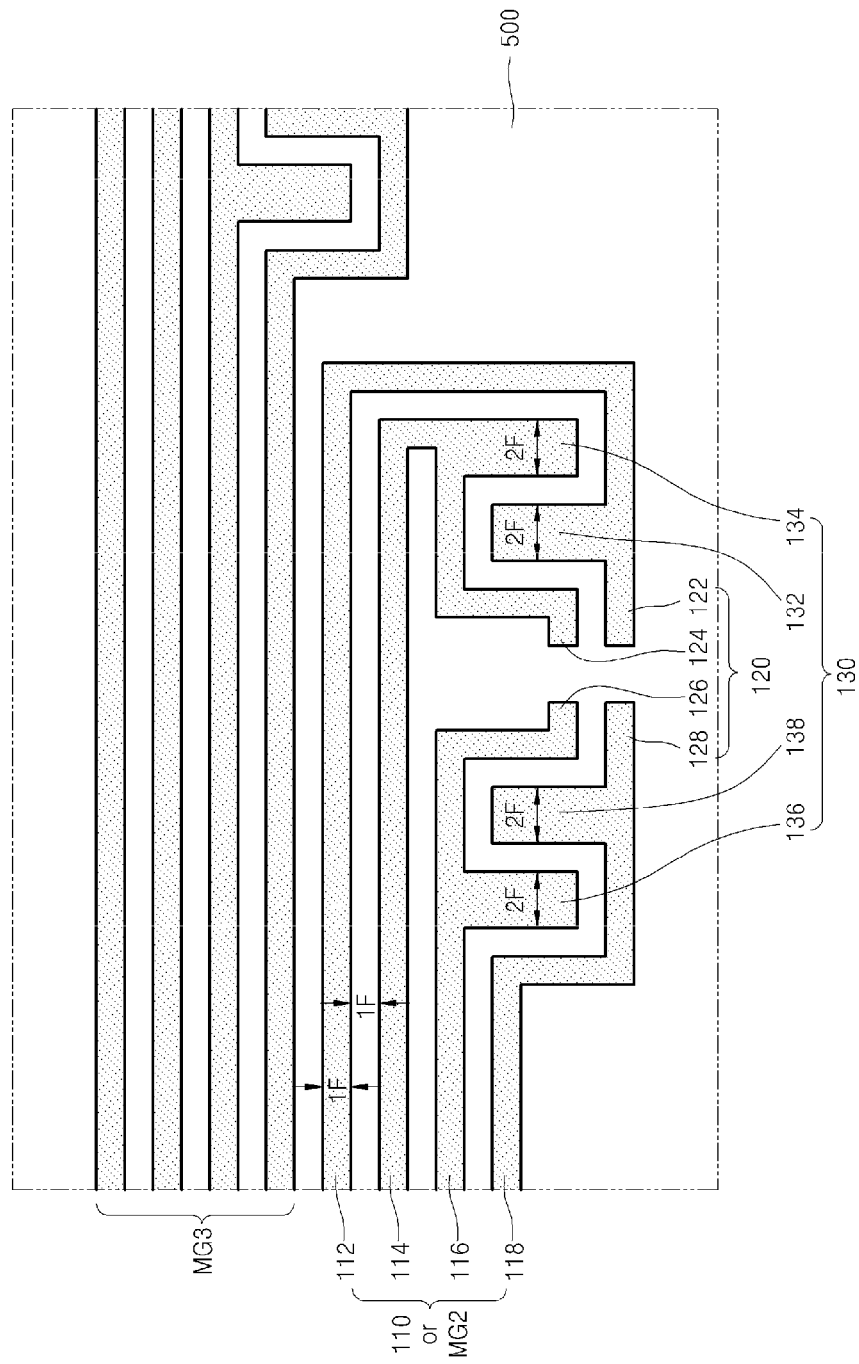

Referring to FIG. 14, a trim process for cutting the second conductive line structure 120 may be performed to electrically isolate the first through fourth conductive lines 112, 114, 116, and 118 of the first conductive line structure 110 from one another. Thus, the first through fourth pads 132, 134, 136, and 138 corresponding respectively to the first through fourth conductive lines 112, 114, 116, and 118 of the first conductive line structure 110 may be electrically isolated from one another.

The trim process may be performed on a portion of the second conductive line structure 120 foamed adjacent to the second protrusion 424 of FIG. 5A in the first direction. Thus, when the second protrusion 424 has a small first-directional width, the third portion (2-3) c and the fourth portion (2-4) d of the second conductive line 124, and the first portion (3-1) a3, and the second portion (3-2) b3 of the third conductive line 126 in FIG. 4 may be removed during the trim process. After the trim process, the first conductive line structure 110, the second conductive line structure 120, and the pad structure 130 may be formed on the substrate 500 in the same structure as shown in FIG. 3 or FIG. 4.

In FIG. 3, the conductive pattern 700 for the peripheral circuit may be formed in the peripheral circuit region during the formation of conductive lines. For example, before forming the conductive lines in the method operations of FIGS. 13A through 13C, a mask pattern may be formed on the peripheral circuit region, and an etch process may be performed using the mask pattern to form the conductive pattern 700.

In the method of forming the patterns of the semiconductor device according to the present embodiment, conductive lines may be formed to a width and interval of 1 F, which is a minimum feature size, and a pad with a width of 2 F may be simultaneously formed during the formation of the conductive lines. Thus, an additional photolithography process for forming the pad may not be required.

Figure 15A:
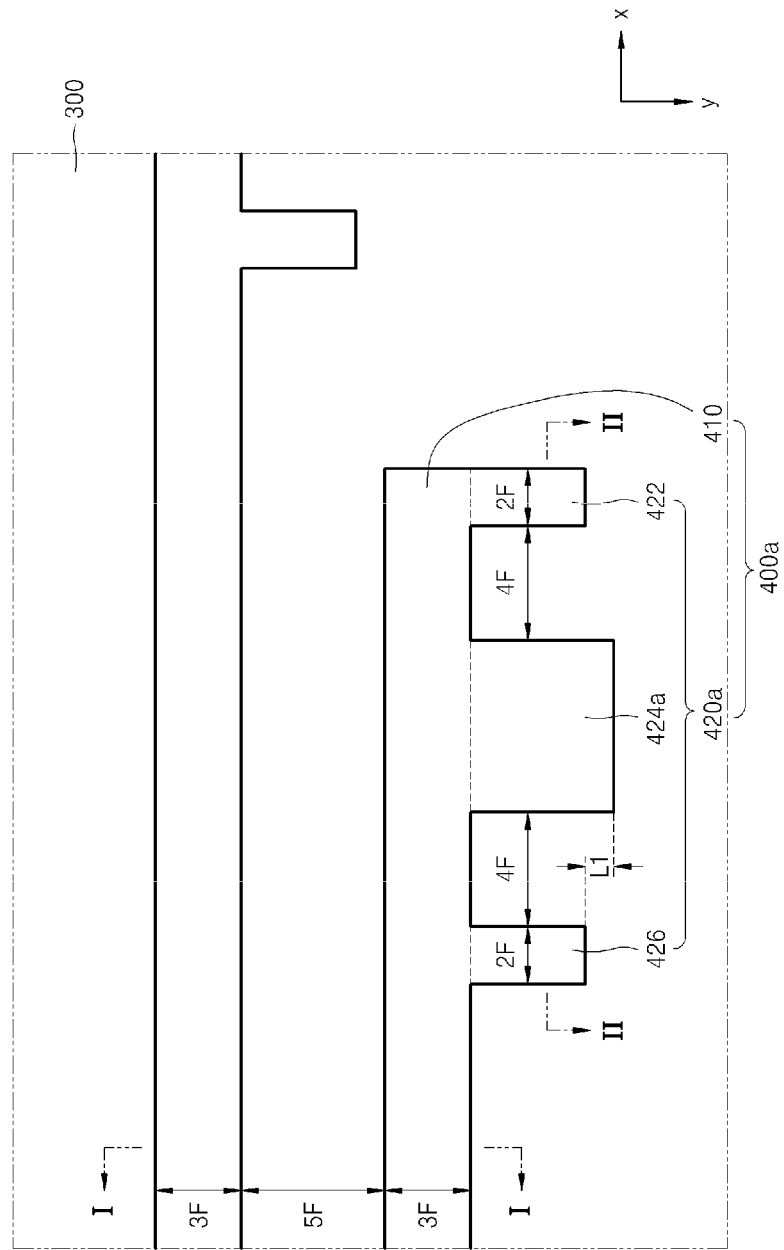
FIGS. 15A and 15B are plane views illustrating a method of forming patterns of a semiconductor device according to an exemplary embodiment of the inventive concept.
Figure 15B:
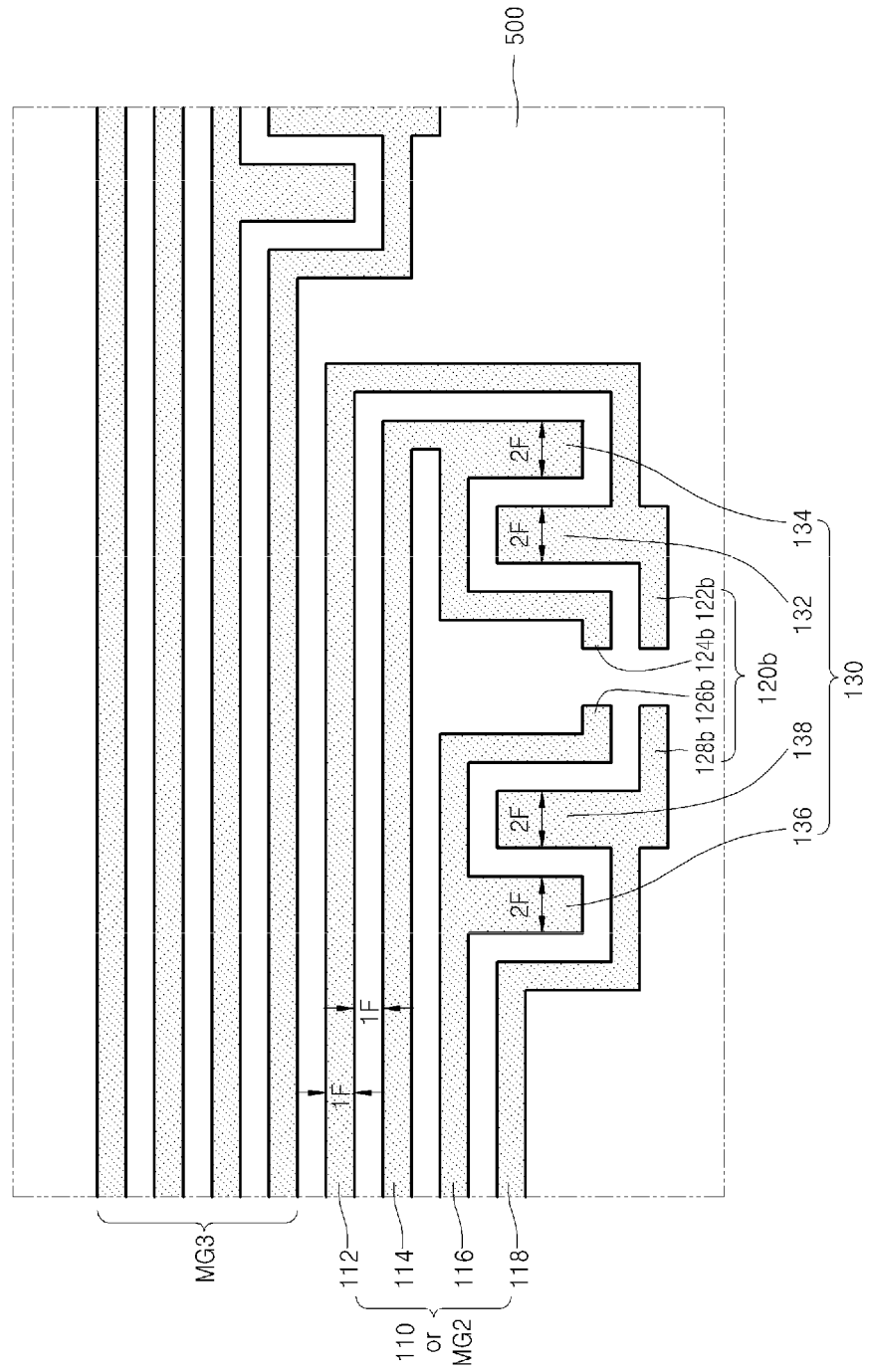

FIGS. 15A and 15B are views illustrating a method of forming patterns of a semiconductor device according to another exemplary embodiment of the inventive concept. FIG. 15A corresponds to FIG. 5A, and FIG. 15B corresponds to FIG. 14.

Referring to FIG. 15A, a PR pattern 400a having a shape shown in FIG. 15A may be formed on an ARC layer 300. The PR pattern 400a may have a similar shape to the PR pattern 400 of FIG. 5A except for the structure of a second protrusion 424a. Specifically, the PR pattern 400 of FIG. 5A may include the second protrusion 424 having the same second-directional (or y-directional) length as other protrusions, that is, the first and third protrusions 422 and 426, while the PR pattern 400a of FIG. 15A according to the present embodiment may include the second protrusion 424a having a second-directional length greater by a length L1 than the first and third protrusions 422 and 426. For brevity, FIG. 15A illustrates that the length L1 is equal to the minimum feature size 1 F. The first protrusion 422 may have the same second-directional length as the third protrusion 426 as shown in FIG. 5A.

As described above, the first through third protrusions 422, 424a, and 426 may be formed to an appropriate second-directional length in consideration of the size of a metal contact contacting a pad. However, the second protrusion 424a may not affect the length of the pad. Thus, the second protrusions 424a may be formed to different lengths from the first or third protrusions 422 or 426. The PR pattern 400a according to the present embodiment may have the same standard width and space as described with reference to FIG. 5A.

After forming the PR pattern 400a, subsequent processes may be performed in the same manner as described with FIGS. 6A through 14.

Referring to FIG. 15B, a pattern forming method may be performed using the PR pattern 400a of FIG. 15A so that a first conductive line structure 110, a second conductive line structure 120b, and a pad structure 130 can be finally obtained. As shown in FIG. 15B, since the second protrusion 424a of the PR pattern 400a is formed to a greater length than other protrusions, a portion of the second conductive line structure 120b corresponding to the second protrusion 424a may further protrude downward in the second direction. For example, each of a second portion (1-2) of a first conductive line of the second conductive line structure 120b and a second portion (4-2) of a fourth conductive line of the second conductive line structure 120b may have a downward protrusion with a step difference. Each of a third portion (2-3) of a second conductive line of the second conductive line structure 120b and a first portion (3-1) of a third conductive line of the second conductive line structure 120b may further extend by as much as the step difference downward in the second direction. A fourth portion (2-4) of the second conductive line of the second conductive line structure 120b and a second portion (3-2) of the third conductive line of the second conductive line structure 120b may move by as much as the step difference downward in the second direction. Here, the step difference may be equal to the length L1.

Figure 16A:
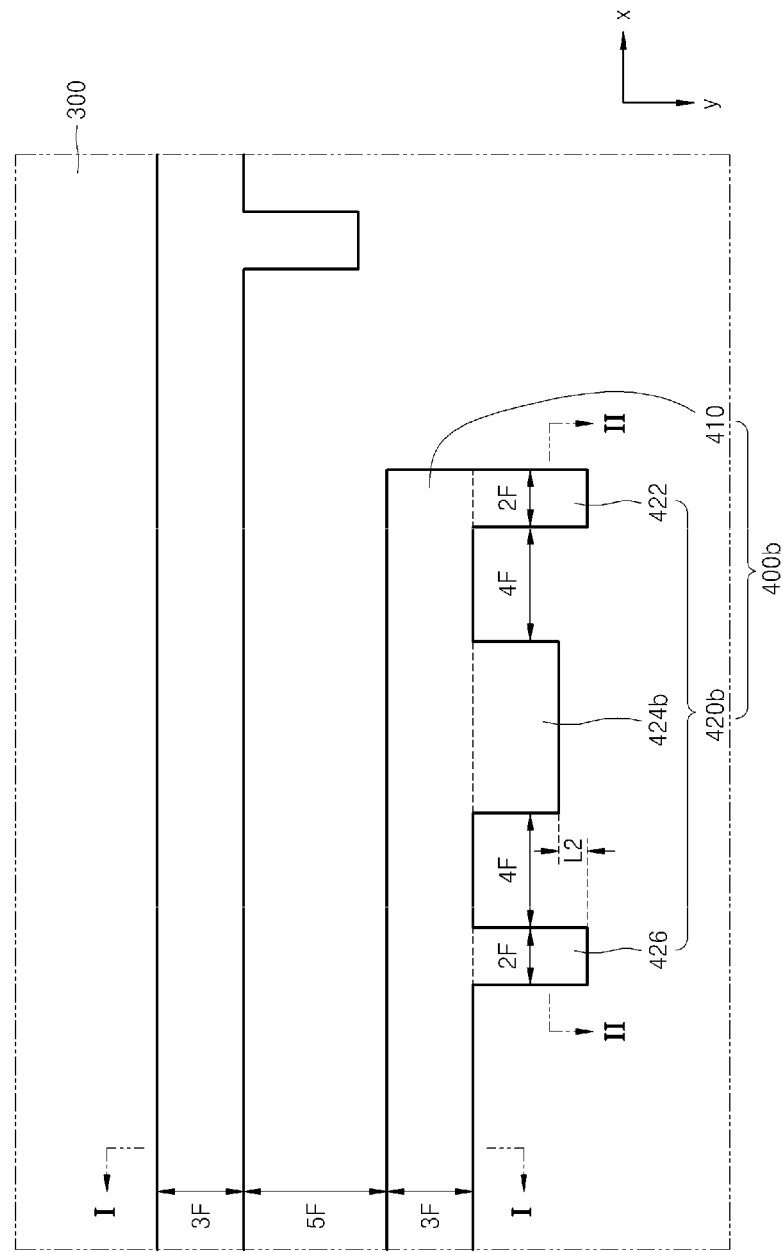
FIGS. 16A and 16B are respectively a plane views illustrating a method of forming patterns according to another exemplary embodiment of the inventive concept.
Figure 16B:
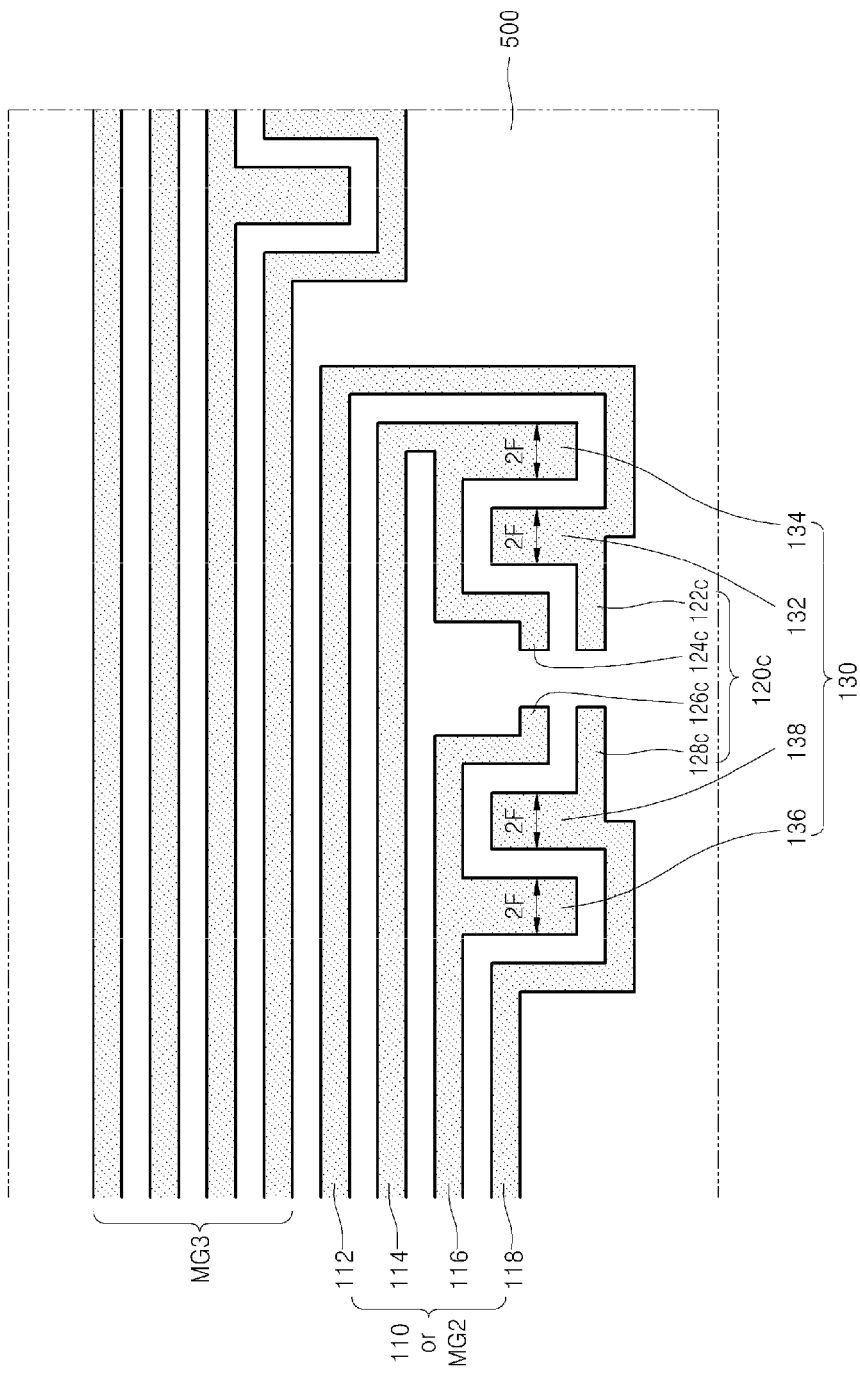

FIGS. 16A and 16B are views illustrating a method of forming patterns of a semiconductor device according to another exemplary embodiment of the inventive concept. FIG. 16A corresponds to FIG. 5A, and FIG. 16B corresponds to FIG. 14.

Referring to FIG. 16A, a PR pattern 400b may be formed on the ARC layer 300. Contrary to the PR pattern 400a of FIG. 15A, in the PR pattern 400b of FIG. 16A, the second-directional (or y-directional) length of the second protrusion 424b may be shorter by a length L2 than that of the first protrusion 422 or the third protrusion 426. For brevity, FIG. 16A illustrates that the length L2 is equal to the minimum feature size 1 F. When the pattern of the semiconductor device is formed based on the PR pattern 400b with the above-described structure using the method operations of FIGS. 6A through 14, the first conductive line structure 110, a second conductive line structure 120c, and the pad structure 130 may be formed as shown in FIG. 16B.

Referring to FIG. 16B, the second protrusion 424b may be formed to a smaller length than other protrusions, so that a portion of the second conductive line structure 120c corresponding to the second protrusion 424b can protrude downward in the second direction less than the second protrusion 424 (FIG. 5A). For example, each of a second portion (1-2) of a first conductive line of the second conductive line structure 120c and a second portion (4-2) of a fourth conductive line of the second conductive line structure 120c may include an upward protrusion with a step difference. Each of a third portion (2-3) of a second conductive line of the second conductive line structure 120c and a first portion (3-1) of a third conductive line of the second conductive line structure 120c may be further shortened by as much as the step difference. Each of a fourth portion (2-4) of the second conductive line of the second conductive line structure 120c and a second portion (3-2) of the third conductive line of the second conductive line structure 120c may move by as much as the step difference upward in the second direction. Here, the step difference may be equal to the length L1.

Figure 17B:
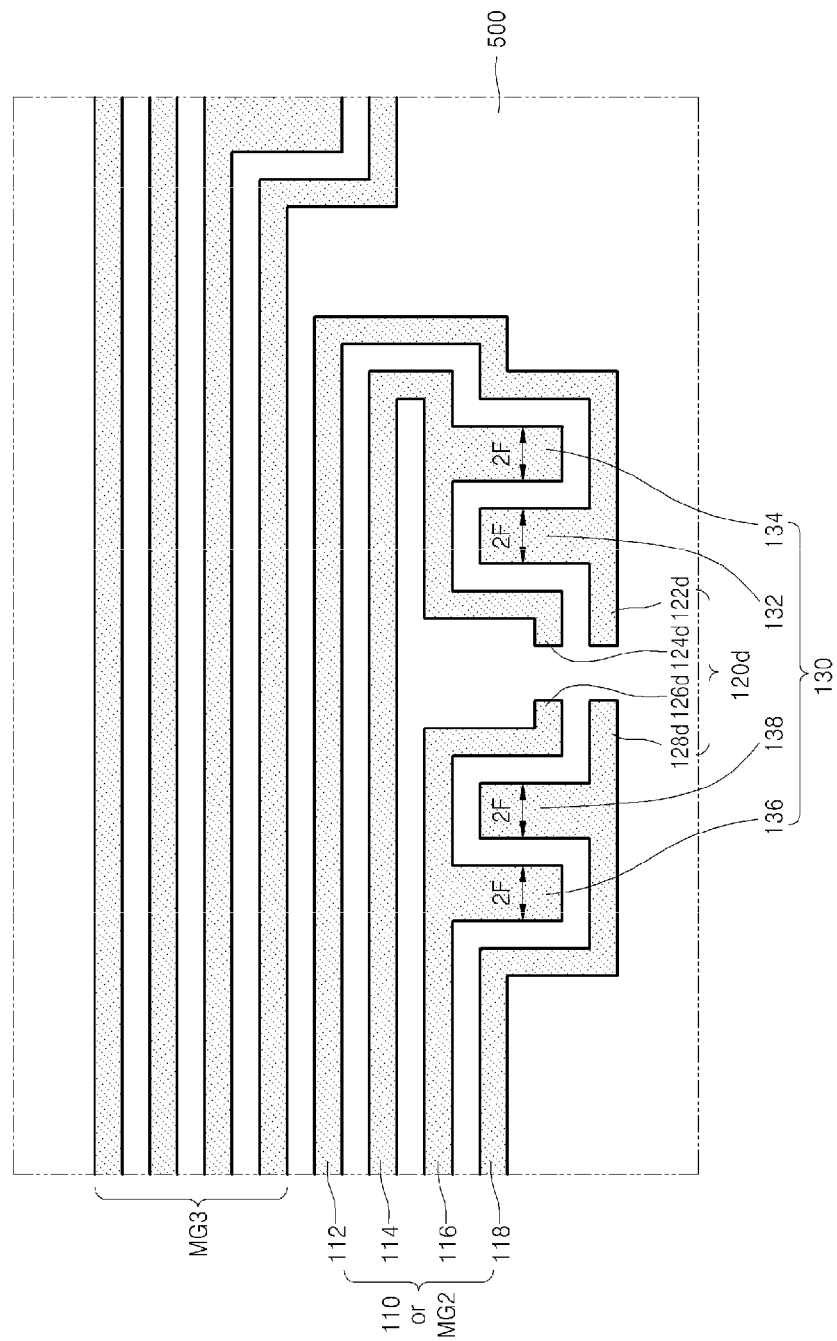

FIGS. 17A and 17B are views illustrating a method of forming patterns of a semiconductor device according to another exemplary embodiment of the inventive concept. FIG. 17A corresponds to FIG. 5A, and FIG. 17B corresponds to FIG. 14.

Referring to FIG. 17A, a PR pattern 400c may be formed on the ARC layer 30. The PR pattern 400c may have a similar shape to the PR pattern 400a of FIG. 5A except for the structure of a region 410c.

Referring to FIG. 17A, a PR pattern 400c may be formed on the ARC layer 300. The PR pattern 400 may have a similar shape to the PR pattern 400a of FIG. 5A except for the structure of a first region 410c. Specifically, FIG. 5A illustrates that a right section of the first region 410 corresponds to a right side of the first protrusion 422, while FIG. 17A illustrates that a right section of the first region 410c protrudes from a right side of the first protrusion 422 by a length L3 in a first direction. For brevity, FIG. 17A illustrates that the length L3 is equal to twice the minimum feature size (i.e., 2 F). As described above, the right section of the first region 410c may protrude irrespective of formation of a pad.

After forming the PR pattern 400c, subsequent processes may be performed in the same manner as described with reference to FIGS. 6A through 14.

Referring to FIG. 17B, a pattern forming method may be performed using the PR pattern 400c of FIG. 17A so that a first conductive line structure 110, a second conductive line structure 120d, and a pad structure 130 can be finally obtained. As shown in FIG. 17B, as the section of an end of the first region 410c of the PR pattern 400c protrudes from a right side of the first protrusion 424, portions of the first and second conductive line structures 110 and 120d corresponding to the section of the end of the first region 410c may protrude by a length L3 rightward in the first direction. For example, the first conductive line 112a, the second conductive line 114a, and the third portion (2-3) of the second conductive line may extend by the length L3 in the first direction, the first portion (1-1) of first conductive line may comprise a step difference with a length of L3 rightward, and the second portion (2-2) of the second conductive line may move by the length of L3 rightward in the first direction.

Figure 18A:
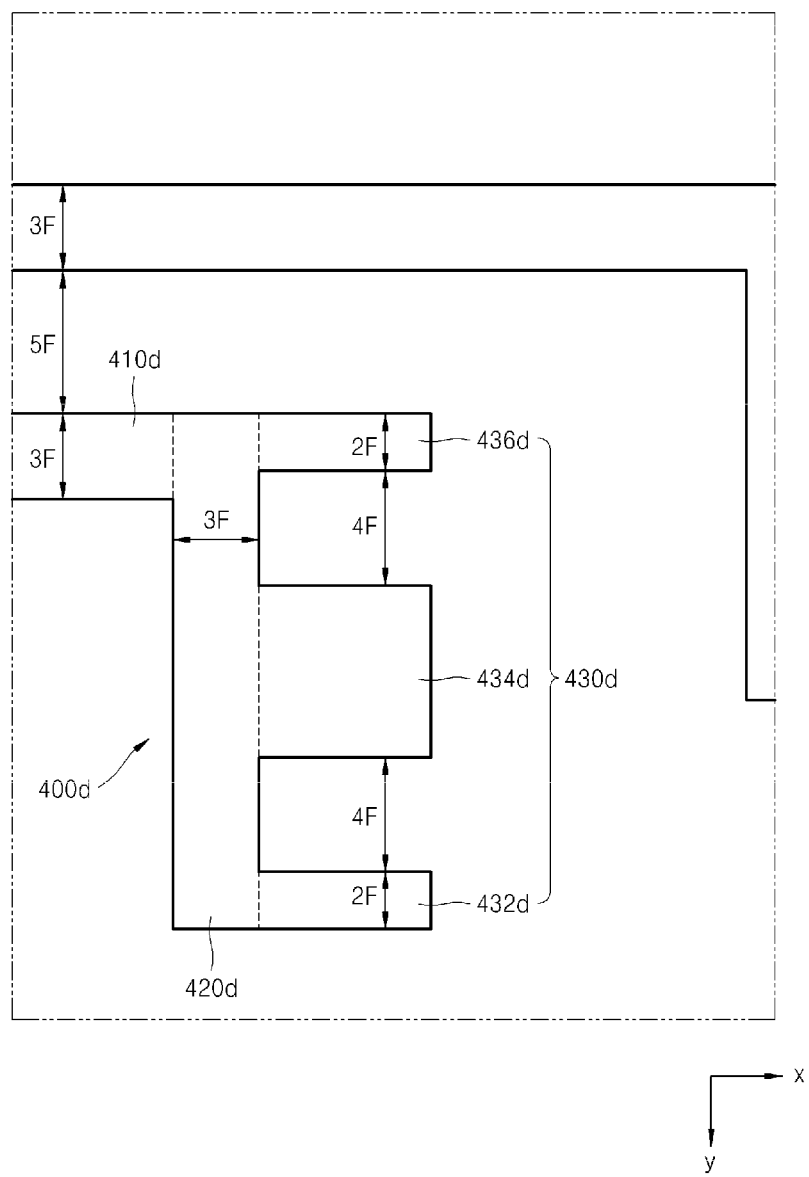
FIGS. 18A and 18B are respectively a plane views illustrating a method of forming patterns according to still another exemplary embodiment of the inventive concept.
Figure 18B:
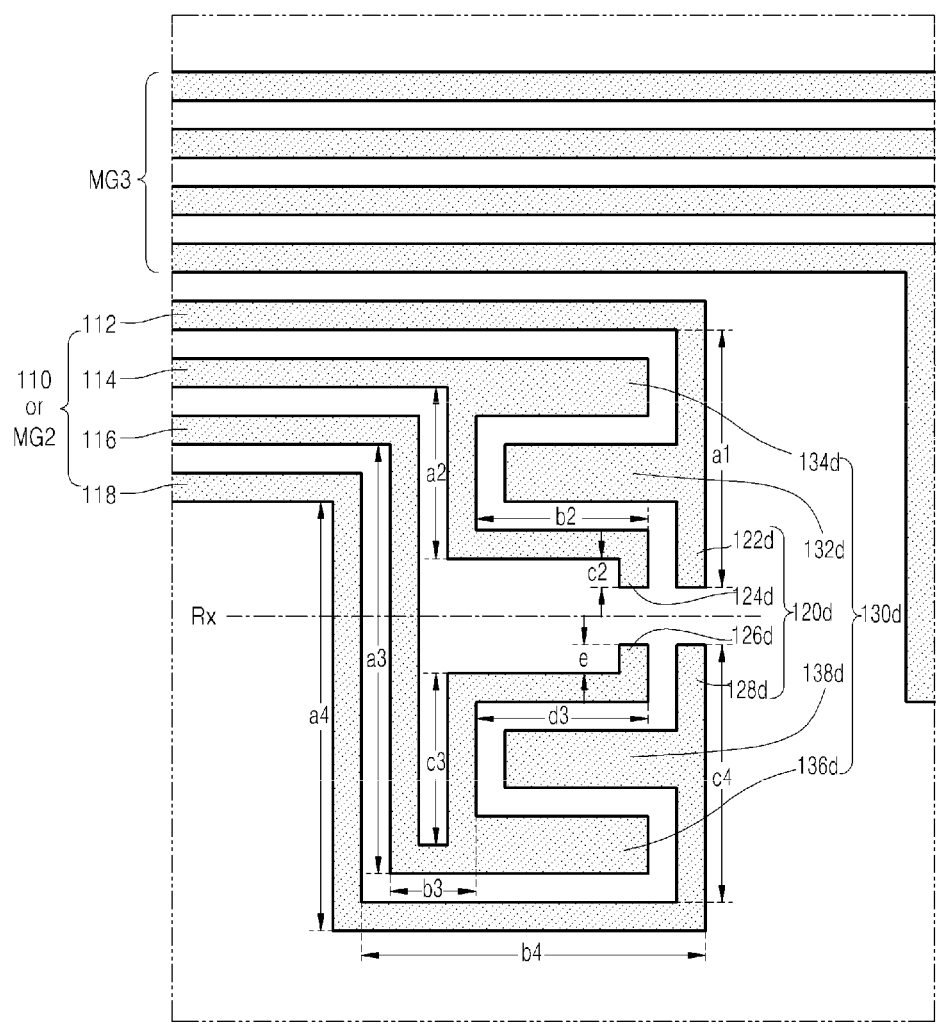

FIGS. 18A and 18B are views illustrating a method of forming patterns of a semiconductor device according to another exemplary embodiment of the inventive concept. FIG. 18A corresponds to FIG. 5A, and FIG. 18B corresponds to FIG. 14.

Referring to FIG. 18A, a PR pattern 400d may be formed on an ARC layer 300. The PR pattern 400d may include first through third regions 410d, 420d, and 430d. The first region 410d may extend in a first direction and have a second-directional width 3 F. The second region 420d may be branched from the first region 410d downward in a second direction and have a first-directional width 3 F. The third region 430d may include first through third protrusions 432d, 434d, and 436d, which may protrude from the second region 420d rightward in the first direction.

The third region 430d may be similar to the second region 420 of FIG. 5A except for branched regions and direction of protrusions. Specifically, FIG. 5A illustrates that the second region 420 is branched from the first region 410 and protrudes downward in the second direction, while FIG. 18A illustrates that the third region 430d is branched from the second region 420d and protrudes rightward in the first direction.

The first protrusion 432d may protrude in a rectangular shape from a lower end of the second region 420d in the first direction and have a second-directional width 2 F. The third protrusion 436d may protrude in a rectangular shape from an upper end of the second region 420d in the first direction and have a second-directional width 2 F. The second protrusion 434d may protrude in a rectangular shape from a central portion of the second region 420d in the first direction. The second protrusion 434d may be formed to an appropriate second-directional width in consideration of an interval required for a subsequent trim process. Each of the first and third protrusions 432d and 436d may be spaced an interval of 4 F apart from the second protrusion 434d in the second direction.

Although the first through third protrusions 432d, 434d, and 436d according to the present embodiment protrude in a different direction from the first through third protrusions 422, 424, and 426 of FIG. 5A, the first through third protrusions 432d, 434d, and 436d according to the present embodiment may have the same width and interval as the first through third protrusions 422, 424, and 426 of FIG. 5A. Accordingly, it may be concluded that it may be only necessary to maintain the width of the first region and the width and interval of the protrusions to simultaneously form conductive lines with a width and interval of 1 F and pads with a width of 2 F. Although the first through third protrusions 422, 424, and 426 may directly protrude from the first region 420 as shown in FIG. 5A, the first through third protrusions 432d, 434d, and 436d may protrude from the second region 420d functioning as a medium as shown in FIG. 18.

In the present embodiment, a plurality of PR patterns 400d may be formed, adjacent PR patterns 400d, that is, adjacent first regions 410d may be formed at an interval of 5 F. In addition, similar to FIG. 15A or 16A, the second protrusion 434d may be formed to a greater or smaller first-directional length than the first protrusion 432d. As shown in FIG. 17A, at least one of lower and upper portions of second-directional ends of the second region 420d may be formed to protrude from the first and third protrusions 432d and 436d.

After forming the PR pattern 400d, subsequent processes may be performed in the same manner as described with reference to FIGS. 6A through 14.

Referring to FIG. 18B, when a pattern of a semiconductor device is formed based on the PR pattern 400d of FIG. 18A using the method operations of FIGS. 6A through 14, a first conductive line structure 110d, a second conductive line structure 120d, and a pad structure 130d may be formed. More specifically, the first conductive line structure 110d may include four conductive lines, for example, first through fourth conductive lines 112d, 114d, 116d, and 118d, which may extend from the memory cell region (refer to 1000A of FIG. 3) to the connection region 1000B in a first direction (or x direction) to be parallel to one another. Each of the first through fourth conductive lines 112d, 114d, 116d, and 118d may have a width of 1 F and be spaced an interval of 1 F apart from adjacent first conductive lines.

The first-directional length of the first conductive line structure 110d may be sequentially reduced downward in the second direction (or y direction). For example, in the first conductive line structure 110d, the first conductive line 112d may be the longest conductive line, the second conductive line 114d may be the second longest conductive line, the third conductive line 116d may be the third longest conductive line, and the fourth conductive line 118d may be the shortest conductive line.

The second conductive line structure 120d may include four conductive lines, for example, first through fourth conductive lines 122d, 124d, 126d, and 128d. Each of the first through fourth conductive lines 122d, 124d, 126d, and 128d of the second conductive line structure 120d may be branched from the corresponding one of the first through fourth conductive lines 112d, 114d, 116d, and 118d of the first conductive line structure 110d in the second direction and have a width of 1 F.

The first conductive line 122d of the second conductive line structure 120d may include a portion (1-1) a1, which may extend from an end of the first conductive line 112d of the first conductive line structure 110d downward in the second direction. The second conductive line 124d of the second conductive line structure 120d may include a first portion (2-1) a2, a second portion (2-2) b2, and a third portion (2-3) c2. The first portion a2 may extend from an end of the second conductive line 114d downward in the second direction. The second portion b2 may extend from an end of the first portion a2 rightward in the first direction. The third portion c2 may extend from an end of the second portion b2 downward in the second direction. The third conductive line 126d of the second conductive line structure 120d may include a first portion (3-1) a3, a second portion (3-2) b3, a third portion (3-3) c3, a fourth portion (3-4) d3, and a fifth portion (3-5) e. The first portion a3 may extend from an end of the third conductive line 116d downward in the second direction. The second portion b3 may extend from an end of the first portion a3 rightward in the first direction. The third portion c3 may extend from an end of the second portion b3 upward in the second direction. The fourth portion d3 may extend from an end of the third portion c3 rightward in the first direction. The fifth portion e may extend from an end of the fourth portion d3 upward in the second direction. The fourth conductive line 128d of the second conductive line structure 120d may include a first portion (4-1) a4, a second portion (4-2) b4, and a third portion (4-3) c4. The first portion a4 may extend from an end of the fourth conductive line 118d downward in the second direction. The second portion b4 may extend from an end of the first portion a4 rightward in the first direction. The third portion c4 may extend from an end of the second portion b4 upward in the second direction.

Each of the first through fourth conductive lines 122d, 124d, 126d, and 128d of the second conductive line structure 120d may be spaced a distance of 1 F apart from any one of other adjacent conductive lines, for example, the first through fourth conductive lines 112d, 114d, 116d, and 118d of the first conductive line structure 110d, the first through fourth conductive lines 122d, 124d, 126d, and 128d of the second conductive line structure 120d, and the first through fourth pads 132d, 134d, 136d, and 138d. To maintain the interval of 1 F, the first through fourth conductive lines 122d, 124d, 126d, and 128d may have different structures and lengths.

The second and third portions b2 and c2 of the second conductive line 124d and the fourth and fifth portions d3 and e of the third conductive line 126d on which the trim process is performed may not be formed according to circumstances.

The pad structure 130d may include four pads, that is, first through fourth pads 132d, 134d, 136d, and 138d. Each of the first through fourth pads 132d, 134d, 136d, and 138d may protrude from the first conductive line structure 110d or the second conductive line structure 120d and be electrically connected to the corresponding one of the first through fourth conductive lines 112d, 114d, 116d, and 118d of the first conductive line structure 110d. The first through fourth pads 132d, 134d, 136d, and 138d may have a second-directional width of 2 F, which is equal to twice the width of the first conductive lines 112d, 114d, 116d, and 118d of the first conductive line structure 110d.

The first pad 132d may protrude from the first portion a1 of the first conductive line 122d leftward in the first direction. The second pad 134d may protrude from the first portion a2 of the second conductive line 124d rightward in the first direction. The third pad 136d may protrude from the third portion c3 of the third conductive line 126d rightward in the first direction. The fourth pad 138d may protrude from the third portion c4 of the fourth conductive line 128d leftward in the first direction. Each of the adjacent first through fourth pads 132d, 134d, 136d, and 138d may be spaced a distance of 1 F apart from any one of other conductive lines, for example, the first through fourth conductive lines 112d, 114d, 116d, and 118d of the first conductive line structure 110d, the first through fourth conductive lines 122d, 124d, 126d, and 128d of the second conductive line structure 120d, and the first through fourth pads 132d, 134d, 136d, and 138d of the pad structure 130d.

Each pair of pads of the first through fourth pads 132d, 134d, 136d, and 138d may be symmetrical to each other about a first-directional central line Rx in the corresponding group. For example, the first and fourth pads 132d and 138d may be symmetrical to each other about the central line Rx, and the second and third pads 134d and 136d may be symmetrical to each other about the central line Rx. The first and second pads 132d and 134d may protrude to zigzag in opposite directions to each other, and the third and fourth pads 136d and 138d may be protrude to zigzag in opposite directions to each other.

Figure 19:
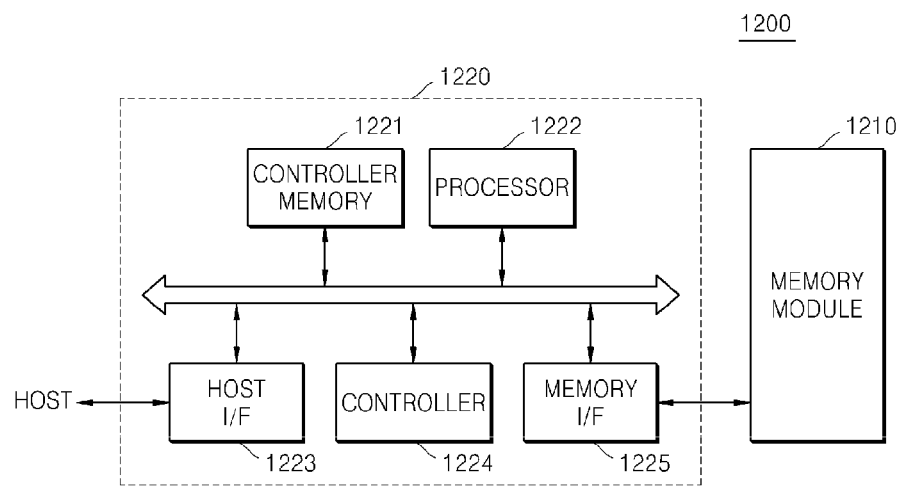
FIG. 19 is a block diagram of a memory card including a semiconductor device fabricated according to exemplary embodiments of the inventive concept.

FIG. 19 is a block diagram of a memory card 1200 including a semiconductor device fabricated according to exemplary embodiments of the inventive concept; and Referring to FIG. 19, the memory card 1200 may include a memory controller 1220 and a memory module 1210. The memory controller 1220 may generate commands and address signals C/A. The memory module 1210 may be, for example, a flash memory including at least one flash memory element. The memory controller 1220 may include a host interface 1223 and a memory interface 1225. The host interface 1223 may transmit the commands and address signals C/A to a host or receive the commands and address signals C/A from the host. The memory interface 1225 may retransmit the commands and address signals to the memory module 1210 or receive the commands and address signals C/A from the memory module 1210. The host interface 1223, a controller 1224, and the memory interface 1225 may communicate with a controller memory 1221, such as a static random access memory (SRAM), and a processor 1222, such as a central processing unit (CPU).

The memory module 1210 may receive the commands and address signals C/A from the memory controller 1220 and store data in at least one of the memory devices of the memory module 1210 or read data from at least one of the memory devices in response to the command and address signals C/A. Each of the memory devices may include a plurality of memory cells and a decoder configured to receive the command and address signals C/A and generate row and address signals to access at least one memory cell capable of being addressed during programming and read operations. Each of the components of the memory card 1200 including, for example, electronic elements, namely, the memory controller 1221, the processor 1222, the host interface 1223, the controller 1224, and the memory interface 1225 included in the memory controller 1220 and the memory module 1210, may be formed to include fine patterns (i.e., conductive lines and pads), which may be formed using the processes according to the embodiments of the present inventive concept.

The present disclosure provides a semiconductor device including high-density patterns with an ultrafine minimum line width and minimum line space, or what may be called an interline interval. These lines and spaces may be formed at sub resolution limits of a photolithography process used for forming the high density patterns of the semiconductor device. There may also be an arrangement to automatically form pads without an additional photolithography process during the formation of the high-density patterns.

According to an aspect of the inventive concept a semiconductor device may include a substrate having a memory cell region and a nearby connection region. A plurality of conductive lines may extend in a first direction from the memory cell region of the substrate to the connection region, and a plurality of second conductive lines may branch out from the first conductive lines on the connection region of the substrate. A plurality of pads may be located on the connection region and be electrically connected to the first conductive lines. The pads may have twice the width of each of the conductive lines, and the pads may form pairs that protrude in opposite directions.

Each of the conductive lines of the first conductive line structure and the conductive lines of the second conductive line structure may have a first width, and a space or interval between the conductive lines may be equal to the first width. The conductive lines of the first conductive line structure may individually be disposed relative to one another in a second direction perpendicular to the first direction. The conductive lines of the first conductive line structure may fall into a plurality of groups, each of which may be fanned by four adjacent conductive lines. The length in the first direction of the first conductive lines may be increased or reduced based upon their relative position in the second direction. The lengths of each group of four conductive lines of the first conductive line structure may be increased or reduced in the second direction.

The conductive lines of the first and second conductive line structures and the pads of the pad structure may be arranged symmetrically about a central line extending in the first direction. Each of the groups may include four conductive lines of the second conductive line structure and four pads of the pad structure. The conductive lines of the second conductive line structure and the pads of the pad structure in all the groups may have the same structure. A pair of pads of the four pads of each of the groups may be symmetrical to each other about a central line disposed in a first-direction or a second-direction. The conductive lines of the first conductive line structure may constitute word lines or bit lines formed in a cell block.

In another aspect of the inventive concept, there may be a semiconductor device having a substrate including a memory cell region and an adjacent connection region. A plurality of first conductive lines extending in a first direction from the memory cell region to the connection region may all have the same line width and the same minimum line spacing. There may be a plurality of second conductive lines extending from the respective first conductive lines in the connection region at least partially in a second direction vertical to the first direction. The second conductive lines may have the same line width as the first conductive lines. There may be a plurality of pads disposed in the connection region and electrically connected to the first conductive lines, either directly or through the second conductive lines, and the pads may have a width equal to twice the width of each of the first conductive lines. The conductive lines of the first conductive line structure may fall into a plurality of groups, each group formed by four adjacent conductive lines of the first conductive line structure. Each of the groups may include four conductive lines and four pads. The second conductive lines and the pads in all the groups may have the same structure, and may be symmetrically disposed about a central line extending in the first direction. Each of the groups may include first through fourth conductive lines of the first conductive line structure, first through fourth conductive lines of the second conductive line structure, and first through fourth pads of the pad structure. Each of the first through fourth conductive lines of the first conductive line structure may have a selected first width, and each of the first through fourth pads may have a width equal to twice the first width in the first direction. The first pad may protrude from the first conductive line of the second conductive line structure. The second pad may protrude from the second conductive line of the second conductive line structure. The first and second pads may protrude to extend in opposite directions from each other, and the second pad may be disposed on a right side of the first pad. The third and fourth pads may be disposed on a left side of the first pad. The third pad may protrude from the third conductive line of the first conductive line structure. The fourth pad may protrude from the fourth conductive line of the second conductive line structure. The third and fourth pads may protrude in opposite directions. The fourth pad may be disposed on a right side of the third pad. The first and second pads may be spaced apart by an interval equal to the first width in the first direction. A right lateral surface of the second pad may be spaced an interval equal to the first width apart from the first conductive line of the second conductive line structure in the first direction. A left lateral surface of the first pad may be spaced the interval equal to the first width apart from the second conductive line of the second conductive line structure in the first direction. The third and fourth pads may be spaced the interval equal to the first width apart from each other in the first direction. A right lateral surface of the fourth pad may be spaced the interval equal to the first width apart from the third conductive line of the second conductive line structure in the first direction. A left lateral surface of the third pad may be spaced the interval equal to the first width apart from the fourth conductive line of the second conductive line structure in the first direction.

According to another aspect of the inventive concept, there is provided a method of forming patterns on a semiconductor device. The method may include forming a conductive layer and an insulating layer on a substrate and forming a first mask pattern on the insulating layer. A first spacer layer may be formed having a thickness equal to a selected target line width on the first mask pattern and the insulating layer. Etching back the first spacer layer may form a first spacer on sidewalls of the first mask pattern. Removing the first mask pattern may leave the spacers on the insulation layer, and etching the insulating layer using the first spacers as an etch mask may be used to form a second mask pattern. Forming a second spacer layer to have a selected thickness equal to a target width of lines in the conductive layer and formed on the second mask pattern, then back etching the second spacer layer to form second spacers on sidewalls of the second mask pattern may result in another mask pattern when the second mask pattern is partially removed using the second spacers as a mask. Etching the conductive layer using the second spacer as an etch mask may form conductive lines with the target width and pads with a width equal to twice the target width. The second mask pattern may include pad regions arranged to have an interval equal to twice the target width since the pad regions may be filled with the second spacer layer during the forming of the first and second spacer layers, and the filled pad regions may be used as the etch mask for forming the pads.

The first mask pattern may be formed using a first mask pattern including a first region extending in a first direction and a second region extending from the first region and having first through third protrusions. The first region may have a second-directional width vertical to the first direction and equal to three times the target width.

The first through third protrusions, which may protrude in a rectangular shape from an end of the first region in the second direction, may be spaced apart from one another with an interval equal to four times the target width from both sides of the second protrusion. The first-directional width of each of the first and third protrusions may be equal to twice the target width. The second mask pattern may include a first portion surrounding the first protrusion, a second portion surrounding a groove between the first and second protrusions, a third portion surrounding a groove between the second and third protrusions, and a fourth portion surrounding the third protrusion. The pad region may include the first through fourth portions. The first-directional width of each of the first through fourth portions may be equal to twice the target width. Forming the second spacer layer may include covering the first through fourth portions with the second spacer layer to fill the first through fourth portions with the second spacer layer. After forming the pads, the method may further include performing a trim process to electrically isolate the conductive lines from one another.

Figure 20:
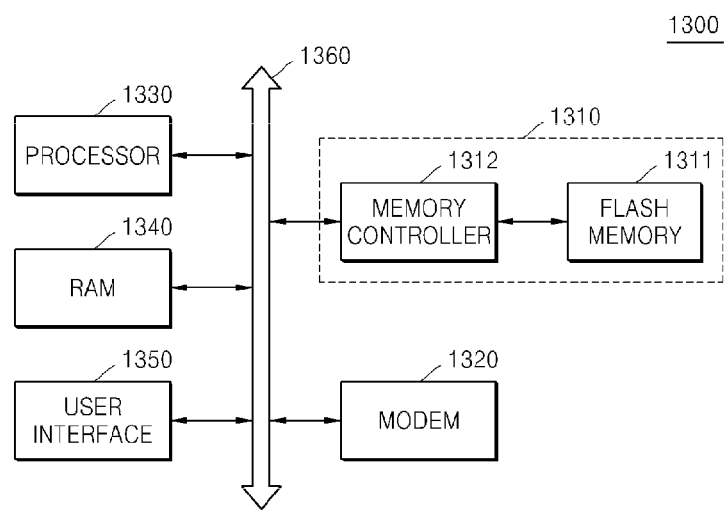
FIG. 20 is a block diagram of a memory system adopting a memory card including a semiconductor device according to exemplary embodiments of the inventive concept.

FIG. 20 is a block diagram of a memory system 1300 adopting a memory card 1310 including a semiconductor device according to exemplary embodiments of the inventive concept.

Referring to FIG. 20, the memory system 1300 may include a processor 1330, such as a CPU, a random access memory (RAM) 1340, a user interface 1350, and a modem 1320, which may communicate data through a common bus 1360. The above-described elements of the memory system 1300 may transmit signals to the memory card 1310 and receive signals from the memory card 1310 through the common bus 1360. Each of components of the memory system 1300, including the memory card 1310, the processor 1330, the RAM 1340, the user interface 1350, and the modem 1320, may be formed to include fine patterns formed using the processes according to the embodiments of the present inventive concept. The memory system 1300 may be applied in the fields of various electronic applications, for example, solid state drives (SSDs), CMOS image sensors (CISs), and computer application chip sets.

For example, memory systems and devices according to the present inventive concept may be packaged as one of various device packages including ball grid arrays (BGAs), chip scale packages (CSPs), plastic leaded chip carrier (PLCCs), plastic dual in-line packages (PDIPs), multi-chip packages (MCPs), wafer-level fabricated packages (WFPs), and wafer-level processed stock packages (WSPs). However, a package structure of the memory systems and devices according to the present inventive concept is not limited thereto.

While the inventive concept has been particularly shown and described with reference to exemplary embodiments thereof, it will be understood that various changes in form and details may be made therein without departing from the spirit and scope of the following claims.

What is claimed is:

1. A method of forming patterns of a semiconductor device, comprising:
    forming a conductive layer and an insulating layer on a substrate and forming a first patterned mask on the insulating layer;
    forming a first spacer layer having a thickness equal to a selected target width on the first patterned mask and the insulating layer;
    etching the first spacer layer to expose at least a top surface of the first patterned mask and form a plurality of first spacers on a sidewall of the first patterned mask;
    removing the first patterned mask;
    etching the insulating layer using the plurality of first spacers as an etch mask to form a second patterned mask;
    forming a second spacer layer to a thickness equal to the target width on the conductive layer and the second patterned mask;
    etching the second spacer layer to form a plurality of second spacers on a sidewall of the second patterned mask and removing the second patterned mask; and
    etching the conductive layer using the plurality of second spacers as an etch mask to form conductive lines with the target width,
    wherein the first patterned mask defines protrusions arranged at a first interval, the first interval being substantially equal to or slightly less than quadruple of the target width and being two target widths larger than the conductive lines of the conductive layer formed in pad regions in which neighboring second spacers are combined together.

2. The method of claim 1, wherein at least one of:
    the first spacer surrounds the first patterned mask;
    the second spacer surrounds the second patterned mask and has a first-directional width equal to twice the selected target width in the pad region; and
    the insulating layer is formed of a plurality of layers and includes an antireflection coating.

3. The method of claim 1, wherein the forming of the first patterned mask comprises forming a first region extending in a first direction, the first region having a second-directional width vertical to the first direction and equal to three times the target width, a second region extending from an end portion of the first region in a second direction and having the first-directional width equal to three times the target width, a third region extending from the second region and including the protrusions having first through third protrusions,
    the first through third protrusions are spaced a distance equal to four times the target width apart from the second protrusion on both sides of the second protrusion, and the second-directional width of each of the first and third protrusions is twice the target width.

4. The method of claim 1, wherein the forming of the first patterned mask includes forming a plurality of unit patterns, each unit pattern formed as an integral type at a second interval equal to five times the target width.

5. The method of claim 4, wherein each of the unit patterns is formed to have a first region extending in a first direction and having a second-directional width perpendicular to the first direction and equal to three times the target width.

6. The method of claim 4, wherein the unit patterns are symmetrically formed about a first-directional central line and the first-directional lengths of unit patterns disposed over and under the central unit patterns in the second direction are sequentially reduced in the second direction.

7. The method of claim 1, wherein the insulating layer includes at least one of a photoresist (PR) layer, an amorphous carbon layer (ACL), and a C-SOH layer, and the first spacer comprises a material having an etch selectivity with respect to the first patterned mask, and the second spacer layer includes a material having an etch selectivity with respect to the insulating layer.

8. The method of claim 1, wherein the second patterned mask includes the insulating layer, the ARC layer, and a portion of the first spacer.

9. The method of claim 1, further comprising performing a trim process to electrically isolate the conductive lines from one another after the forming of the pads.

10. The method of claim 1, wherein the second patterned mask includes pad regions having a space equal to twice the target width, the pad regions filled with the second spacer layer during the forming a second spacer layer, and the filled pad regions are used as the etch mask for forming the pads.

11. A method of forming patterns, comprising:
forming a first layer and a second layer;
forming a first patterned mask on the second layer;
forming a first spacer layer having a thickness equal to a selected target width on the first patterned mask and the second layer;
blanket etching the first spacer layer to expose at least a portion of a top surface of the first patterned mask and form a plurality of first spacers on a sidewall of the first patterned mask;
removing the first patterned mask;
etching the second layer using the plurality of first spacers as an etch mask to form a second patterned mask;
forming a second spacer layer to a thickness equal to the target width on the first layer and the second patterned mask;
blanket etching the second spacer layer to form a plurality of second spacers on a sidewall of the second patterned mask and removing the second patterned mask; and
etching the first layer using the plurality of second spacers as an etch mask to form lines and spaces with the target width,
wherein the first patterned mask defines protrusions arranged at a first interval, the first interval being two target widths larger than the lines of the first layer formed in pad regions in which neighboring second spacers are combined together.

12. The method of claim 11, wherein at, least one of:
the first spacer surrounds the first patterned mask;
the second spacer surrounds the second patterned mask and has a first-directional width equal to a multiple of the selected target width in at least one selected region; and
the second layer is formed of a plurality of layers.

13. The method of claim 12, wherein the second layer includes an antireflection coating.

14. The method of claim 11, wherein the second layer comprises at least one of a photoresist (PR) layer, an amorphous carbon layer (ACL), and a C-SOH layer.

15. The method of claim 11, wherein at least one of the first spacer comprises a material having an etch selectivity with respect to the first patterned mask, and the second spacer layer includes a material having an etch selectivity with respect to the second layer.

16. The method of claim 11, wherein the second patterned mask includes the second layer, an antireflection layer, and at least a portion of the first spacer.

17. A method of forming patterns of a semiconductor device, comprising:
forming a conductive layer and an insulating layer on a substrate and forming a first patterned mask on the insulating layer;
forming a first spacer layer having a thickness equal to a target width on the first patterned mask and the insulating layer;
etching the first spacer layer to expose at least a top surface of the first patterned mask and form a plurality of first spacers on a sidewall of the first patterned mask;
removing the first patterned mask;
etching the insulating layer using the first spacer as an etch mask to form a second patterned mask;
forming a second spacer layer to a thickness equal to the target width on the conductive layer and the second patterned mask;
etching the second spacer layer to form a plurality of second spacers on a sidewall of the second patterned mask and removing the second patterned mask; and
etching the conductive layer using the plurality of second spacers as an etch mask to form conductive lines with the target width,
wherein the first patterned mask defines protrusions arranged at a first interval, the first interval being two target widths larger than the conductive lines of the conductive layer formed in pad regions in which neighboring second spacers are combined together,
wherein the second patterned mask includes pad regions filled with combined neighboring second spacers during the etching the second spacer layer to form a plurality of second spacers, and the filled pad regions are used as an etch mask for forming pads,
wherein the forming a first patterned mask includes forming a first region extending in a first direction, and a second region extending from an end portion of the first region in a second direction and including first through third protrusions,
the first and third protrusions are spaced a distance equal to four times the target width apart from the second protrusion disposed between the first and third protrusions, and
the pad regions correspond to the first and third protrusions, a space between the first and second protrusions, and a space between the second and third protrusions.

18. The method of claim 17, wherein the first region has a width approximately equal to three times the target width in a second direction, the second direction being perpendicular to the first direction.

19. The method of claim 17, wherein a first-directional width of each of the first and third protrusions is twice the target width.

20. The method of claim 17, wherein the pad regions have a space equal to or less than twice the target width.

* * * * *